US006492203B1

(12) United States Patent
Wakashima et al.

(10) Patent No.: US 6,492,203 B1
(45) Date of Patent: Dec. 10, 2002

(54) SEMICONDUCTOR DEVICE AND METHOD OF FABRICATION THEREOF

(75) Inventors: Yoshiaki Wakashima, Kawasaki (JP); Naoki Fukutomi, Tokyo (JP); Kazuhisa Suzuki, Nagareyama (JP); Toshio Yamazaki, Ogo-ri (JP); Tsutomu Kitakatsu, Ichihara (JP); Susumu Naoyuki, Yuki (JP); Akinari Kida, Shimotsuga (JP)

(73) Assignee: Hitachi Chemical Company, Ltd. (JP)

( * ) Notice: Subject to any disclaimer, the term of this patent is extended or adjusted under 35 U.S.C. 154(b) by 113 days.

(21) Appl. No.: 09/680,369

(22) Filed: Oct. 5, 2000

Related U.S. Application Data

(63) Continuation-in-part of application No. 09/423,062, filed as application No. PCT/JP98/01970 on Apr. 30, 1998, now Pat. No. 6,268,648.

(30) Foreign Application Priority Data

Apr. 30, 1997 (JP) ............................................. 9-112753
Feb. 6, 1998 (JP) ............................................. 10-25896
Oct. 15, 1999 (JP) ............................................ 11-294604

(51) Int. Cl.[7] ......................... H01L 21/44; H01L 21/48; H01L 21/50
(52) U.S. Cl. ........................ 438/127; 438/112; 438/126
(58) Field of Search ................................ 438/116, 106, 438/108, 112, 113, 126, 127, 460, 758, 780

(56) References Cited

U.S. PATENT DOCUMENTS

| | | | | |
|---|---|---|---|---|
| 4,250,073 A | * | 2/1981 | Tamura et al. | 524/104 |
| 5,051,275 A | * | 9/1991 | Wong | 257/788 |
| 5,391,460 A | * | 2/1995 | Dougherty et al. | 164/526 |
| 5,946,556 A | * | 8/1999 | Hashizume | 438/124 |
| 6,019,932 A | * | 2/2000 | Kambara | 264/102 |

FOREIGN PATENT DOCUMENTS

| | | | | |
|---|---|---|---|---|
| JP | 50-147292 A | 11/1975 | | H01L/27/02 |
| JP | 63-198186 A | 8/1988 | | G06M/7/00 |
| JP | 2-095246 | 7/1990 | | H01L/23/02 |

(List continued on next page.)

OTHER PUBLICATIONS

Okuno, High Reliability, High Density, Low Cost Packaging Systems for Matrix Systems for Matrix BGA and CSP by Vacuum Printing Encapsulation Systems (VPES), Aug. 1999, IEEE Transactions on Advanced Packaging, vol. 22, No. 3, pp 391–397.*
Okuno, Wafer Level CSP Process by VPES (Vacuum Printing Encapsulation Systems), 2000, Int'l Symp on Electronic Materials and Packaging, pp 143–151.*
Texanol Product Data Sheet, May 2001, Eastman Chemical Company.*

*Primary Examiner*—Richard Elms
*Assistant Examiner*—Adam Pyonin
(74) *Attorney, Agent, or Firm*—Pennie & Edmonds LLP

(57) ABSTRACT

A semiconductor device fabrication process comprising an encapsulation step of carrying out encapsulation by vacuum pressure differential printing by the use of a liquid resin encapsulant containing a solvent in an amount of from 5% by weight to 50% by weight, and preferably from 25% by weight to 50% by weight. The encapsulation step comprises: printing the liquid resin encapsulant by vacuum pressure differential printing in such a way that; the encapsulant covers at least an internal connecting terminal provided on a substrate, a semiconductor chip, and a wire interconnecting the internal connecting terminal and the semiconductor chip; and that the thickness of the encapsulant lying above the wire at the highest position of the wire comes to be at least 0.8 times the thickness of the encapsulant lying beneath the wire at the same position; and curing or drying the encapsulant.

8 Claims, 24 Drawing Sheets

FOREIGN PATENT DOCUMENTS

| | | | | |
|---|---|---|---|---|
| JP | 2-142540 | 12/1990 | ........... | H01L/23/12 |
| JP | 3-163861 A | 7/1991 | ........... | H01L/25/00 |
| JP | 3-177055 A | 8/1991 | ........... | H01L/23/12 |
| JP | 4-340750 A | 11/1992 | ........... | H01L/23/12 |
| JP | 6-224304 A | 9/1994 | ........... | H01L/23/12 |
| JP | 6-244304 A | 9/1994 | ........... | H01L/23/12 |
| JP | 7-094628 A | 4/1995 | ........... | H01L/23/12 |
| JP | 10-303329 | 11/1998 | | |
| WO | WO 98/49726 | 11/1998 | | |

* cited by examiner

SEMICONDUCTOR DEVICE AND METHOD OF FABRICATION THEREOF

This application is a Continuation-In-Parts of co-pending application Ser. No. 09/423,062, filed on Oct. 29, 1999, now U.S. Pat. No. 6,268,648, which is bases on PCY/JP98/01970 filed Apr. 30, 1998 the contents of which are incorporated herein by reference in their entirety. This application is based on Japanese Patent Applications No. 10-546833 and No. 11-294604 filed in Japan, the contents of which are incorporated herein by reference.

BACKGROUND OF THE INVENTION

1. Field of the Invention

The present invention is related to a semiconductor device and a method of fabrication thereof.

2. Description of the Related Art

There is a growing need for a smaller semiconductor device package with multiple terminal pins due to increases of an integration rate and an operation frequency in the recent semiconductor device. However, a package size of a conventional peripheral terminal type utilizing a leadframe has to be made larger if a number of the terminals should be increased further. One of countermeasures is to decrease a terminal pitch in the package. However, it is difficult to make the terminal pitch narrower than 0.4 mm.

To accommodate such increasing number of the terminals, an area array type package with its terminals disposing over a surface plane is introduced. The area array type package requires to have a wiring substrate for providing wiring from chip terminals to external terminal electrodes. The chip may be mounted either at the upper surface or the lower surface of the wiring substrate when the external terminal electrodes are disposed at the lower surface of the wiring substrate. When the chip is mounted on the upper surface of the wiring substrate, interlayer connections between the upper surface and the lower surface of the wiring substrate have to be provided. When the chip is mounted on the lower surface of the wiring substrate, the interlayer connections will not be required. However, a hollow space has to be provided to absorb total thickness of the chip and its sealing material when the chip is mounted on the lower surface of the wiring substrate.

The hollow space is called a cavity, and a structure with the cavity at the lower surface of the wiring substrate is called a cavity down structure. Typically, the structure can be made by hollowing out a substrate, or by making a hole through the substrate and adhering a base plate thereto. Wiring for a multiple layer structure is required when heights of chip bonding portions and external electrodes are changed because the wiring is also disposed on the same surface in this structure. According to the methods described above, a wiring structure, which satisfies required conditions for a three dimensional spatial relationships among the chip mount portion, the chip bonding portion and the external electrode portion.

One of the area array type semiconductor package is Ball Grid Array (BGA) in which solder balls are used as connection terminals. Cost of the BGA is higher than that of a semiconductor device fabricated with a conventional leadframe, and reduction of the cost is anticipated. The higher cost is due to a fact that a structure and fabricating process of the semiconductor chip package substrate are more complex than that of a substrate with the leadframe. Accordingly, it is anticipated the development of simpler structure and fabricating process of the semiconductor chip package substrate.

The wiring substrate used for the area array type semiconductor package is typically called an interposer. The interposer may be roughly classified into a film type and a rigid type. A number of the wiring layers can be either one, or two, or three and more layers. Generally, the fabricating cost is lower for a fewer number of the wiring layers.

The lowest cost is expected with the single layer wiring structure. If the wiring is disposed at least in both surfaces of the interposer, the semiconductor chip mount portion and the external terminals may be divided at the upper and the lower surfaces. However, the semiconductor chip mount portion and the external terminals are disposed on the same surface of the interposer with the single layer wiring structure. In such a single layer wiring structure, it is required to have the cavity portion on the wiring surface with a depth at least comparable to a thickness of the chip so as to store the chip therein. A method of fabricating such a cavity portion has become an important subject.

In the interposer so called TAB (Tape Automated Bonding) or TCP (Tape Carrier Package) and their packaging technology, the center portion of the interposer is bored through to store the semiconductor chip. With the rigid plate, the center portion of the interposer is similarly bored through to hollow the semiconductor chip store portion out and adhere a metal plate as the base plate thereto, or the cavity portion is fabricated at the center portion of the interposer. The wiring is disposed only in a flat plane portion, not inside the cavity portion.

In conventional semiconductor devices employing lead frames, transfer molding has been in wide use for their fabrication. However, in the fabrication of semiconductor devices in recent years where semiconductor chips are mounted on substrates, the transfer molding, which requires expensive and long-time-to-delivery molds, has become adaptable with difficulty though still used in some cases, because it is difficult for the substrates used and package structure to be standardized.

Accordingly, liquid resin encapsulation (sealing) is highlighted which requires no mold and is suited especially when small quantity and many kinds of products are manufactured in a short time to delivery. Dispensing, printing and vacuum pressure differential printing are known as chief methods for such encapsulation making use of a liquid resin encapsulant (sealant).

FIG. 24C perspectively illustrates an encapsulation target where a semiconductor chip 1 is mounted on a substrate 7 and this chip 1 and a conductor wiring 2 are connected through wires 3 by wire bonding. In conventional dispensing, as shown in FIG. 24A, a solder resist 25 is provided on the surface of the conductor wiring 2 of this chip-mounting substrate. On that surface an encapsulation dam 26 is provided as shown in FIG. 24B, and a liquid resin encapsulant 4 is poured therein to encapsulate the chip 1 as shown in FIG. 24D. In this method, however, especially in the case of fine-pitch wire bonding, the resin encapsulant 4 may come around with difficulty beneath the wires 3 at the time of encapsulation to tend to cause encapsulation defects 20 such as air bubbles and faulty filling, also resulting in a low productivity.

Printing is known as a liquid resin encapsulation method that can achieve a productivity comparable to that of transfer molding. The printing is a method in which as shown in FIG. 25A an encapsulant 4 is printed via a printing mask 28 and thereafter as shown in FIG. 25B the printing mask 28 is removed, whereby a chip 1 is encapsulated. This method promises a high productivity, but, in the case of fine-pitch wire bonding, tends to cause encapsulation defects 20 such as faulty filling and air bubbles beneath bonded wires 3 or at the part with complicated or delicate internal structure.

As a method for solving this problem to achieve improvement greatly, there is vacuum pressure differential printing, which has been invented so that printed portions with complicated internal structure can be filled with a printing resin without leaving any air bubbles.

In this method, the whole printing portions, i.e., part or the whole of a printing device, a printing mask 28, a liquid resin encapsulant 4, and a printing-target wiring substrate 1 with a semiconductor chip mounted thereon, and so forth, are placed in a vacuum container, where first-time printing is carried out firstly in the state the vacuum container is kept at a high vacuum (FIG. 26A). When left in this state, any delicate areas of printed portions can be filled with the resin with difficulty, so that an empty space 21 may remain.

Accordingly, the vacuum container is then brought to medium-vacuum condition, whereupon the high-vacuum empty space 21 not filled with the resin at the first-time printing is crushed up to the medium-vacuum condition to become almost free of the empty space 21 and simultaneously a depression 22a appears at the resin surface to an extent corresponding to the resin with which the open space has been filled (FIG. 26B).

In that state, second-time printing is carried out as it is kept in medium vacuum, to fill up the depression 22a of the resin surface (FIG. 26C). Thereafter, the vacuum is returned to atmospheric pressure, the printing mask 28 is removed, and the printed article is taken out, thus the resin encapsulation is completed.

During the first-time printing (FIG. 26A) carried out in high vacuum, the empty space 21 comes into being where the resin has not been packed into any delicate areas lying beneath bonding wires. Here, if the resin layer lying above the empty space 21, i.e., the resin layer formed on the bonding wires 3 has a thickness smaller than the depth of the high-vacuum empty space 21 21 lying beneath the wires 3, the resin layer may break when the resin is sucked in the high-vacuum empty space 21 during the printing carried out in medium-vacuum condition, so that the empty space or air bubbles 22 kept in medium vacuum may remain in the resin (FIG. 26B). This phenomenon is called a pressure differential short circuit.

Even if in this state the resin for the portion of the depression, corresponding to the resin sucked therein, is supplied by the second-time printing, air bubbles 20 may remain as shown in FIG. 26C, at the time the vacuum is returned to atmospheric pressure. In order to prevent the pressure differential short circuit from being caused when returned to medium vacuum, the resin layer on the bonding wires 3 may beforehand be formed in a sufficiently large thickness. However, a resin layer merely made to have a large thickness makes the package have too large a thickness, and also may bring about a difficulty in the mounting on a mother board because of a protrusion of encapsulation resin when the encapsulation surface and the external terminal surface are identical.

Thus, the vacuum pressure differential printing, though promising a high productivity and usually less causing encapsulation defects, has had a problem that the encapsulation defects (such as air bubbles) 20 tends to come into being once the pressure differential short circuit has occurred.

SUMMARY OF THE INVENTION

An object of the present invention is to obtain a semiconductor device that is compact and inexpensive, has a high reliability and makes it easy to standardize designing and fabrication steps, without causing any encapsulation defects.

The present invention provides a semiconductor device fabrication process comprising an encapsulation step of carrying out encapsulation by vacuum pressure differential printing by the use of a liquid resin encapsulant containing a solvent in an amount of from 5% by weight to 50% by weight, and preferably from 25% by weight to 50% by weight.

The fabrication process of the present invention may further be provided, before the encapsulation step, with;

a mounting step of mounting a semiconductor chip on a substrate having on its surface a surface wiring and a first hollow place (cavity portion), being provided with a second hollow place in a bottom area of the first hollow place and having an internal connecting terminal on the inner wall of the first hollow place; the semiconductor chip being mounted in a bottom area of the second hollow place; and a wire-connecting step of interconnecting the internal connecting terminal and the semiconductor chip through a wire. Here, the encapsulation step is the step of encapsulating at least the internal connecting terminal, the semiconductor chip and the wire. Also, the wire may preferably be held in the interior of the first hollow place and second hollow place (i.e., the wire is positioned lower than the surface of the substrate on which the surface wiring is provided).

The encapsulation step in the fabrication process of the present invention may preferably be the step of printing a liquid resin encapsulant by vacuum pressure differential printing in such a way that the encapsulant covers at least the internal connecting terminal provided on the substrate, the semiconductor chip, and the wire interconnecting the internal connecting terminal and the semiconductor chip, and that the thickness of the encapsulant lying above the wire at the highest position (hereinafter "the apex") of the wire (i.e., at the position close to the encapsulant surface or the surface laid bare to the atmosphere), i.e., the thickness extending from the apex of the wire to the encapsulant surface (the surface laid bare to the atmosphere) comes to be at least 0.8 time the thickness of the encapsulant lying beneath the wire at the same position (i.e., the thickness extending from the apex of the wire to the bottom of the encapsulated portion), and curing or drying the encapsulant.

The present invention also provides a semiconductor device comprising;

a substrate having on its surface a surface wiring and a first hollow place, being provided with a second hollow place in a bottom area of the first hollow place and having an internal connecting terminal on the inner wall of the first hollow place;

a semiconductor chip bonded to a bottom area of the second hollow place;

a wire interconnecting the internal connecting terminal and the semiconductor chip; and an encapsulation member which encapsulates at least the internal connecting terminal, the semiconductor chip and the wire.

Here, the wire may preferably be held in the interior of the first hollow place and second hollow place (i.e., the wire are positioned lower than the surface of the substrate on which the surface wiring is provided). Also, the sidewall of the first hollow place may preferably has a slant, and the wire interconnecting the surface wiring and the internal connecting terminal are provided at the slant.

The present invention still also provides a liquid encapsulant comprising a solvent contained in an amount of from 5% by weight to 50% by weight, and preferably from 25% by weight to 50% by weight, and its use in vacuum pressure differential printing. The present invention is suitable for a semiconductor chip package substrate with a cavity portion, or a semiconductor device fabricated by mounting at least one semiconductor chip in the cavity portion and sealing with plastic sealant, wherein said semiconductor chip package substrate comprises wiring disposed along a surface of the substrate and wall surfaces of the substrate in the cavity portion, the wiring comprises an external connection terminal portion for connecting to external connection terminals which are provided on the surface of the substrate at a side of the cavity portion's opening, an internal connection terminal portion for connecting to the mounted semiconductor chip, and a wiring portion disposed in between the external connection terminal portion and the internal connection terminal portion, the wiring portion is buried in a surface of the substrate and one of said wall surfaces of the substrate in the cavity portion and the internal connection terminal portion is disposed inside of the cavity portion.

For example, the wall surface of the substrate in the cavity portion may be extended toward the bottom surface of the cavity portion with a slant angle which is set within a predetermined angle range. Concretely, the slant angle may be within a range of 5–40°, and preferably within a range of 10–40°. The slant structure may be fabricated so as that a ratio L/G is within a range of 1.5<L/G<10, where G is a height of the slant structure of the wall surface of the substrate in the cavity portion, and L is its horizontal dimension. More preferable range of the ratio L/G is 2<L/G<10, and the most preferable range is 3<L/G<10.

The cavity portion is, for example, formed by a press forming process utilizing a press pattern with a projected portion. The cavity portion may also be formed into a multiple step structure.

Alternatively, the cavity portion may be provided with a semiconductor chip mount portion for mounting semiconductor chip, which is formed by hollowing the cavity portion out further. A depth of the semiconductor chip mount portion which has been hollowed out is preferably larger than a thickness of a semiconductor chip to be mounted therein.

Furthermore, a height of a ramp between the external connection terminal portion disposed on the substrate surface and the internal connection terminal portion disposed inside of the cavity portion may be preferably not less than 0.05 mm in the semiconductor chip package substrate and the semiconductor device according to the present invention.

The terminals of the semiconductor chip mounted inside of the cavity portion and the internal connection terminal portions are wire-bonded, or, directly connected by a face-down bonding.

Furthermore, the wiring in the semiconductor chip package substrate and the semiconductor device according to the present invention may be preferably disposed in an area of the wall surface which does not include any of corner sections of the cavity portion.

Furthermore, the cavity portion may be formed substantially at the center of the major surface plane of the substrate, and the semiconductor chip may be mounted inside of the cavity portion so as the semiconductor chip to be positioned substantially at the center of a dimension of the thickness of the semiconductor chip package substrate. Alternatively, the semiconductor chip may be offset-mounted in the cavity portion with an offset amount of not bigger than 30% of the substrate thickness from the center position of the substrate's thickness along a direction of the thickness. The cavity portion may have a size large enough to mount a plurality of device elements on its bottom surface area, and may be provided with a plurality of wiring sets to the plurality of device elements, and a plurality of semiconductor chips and passive device elements may be mounted in the cavity portion.

Furthermore, the wiring in the semiconductor chip package substrate and the semiconductor device according to the present invention is preferably formed by utilizing a squeeze shapeable wiring construction body consisting of only metals, the squeeze shapeable wiring construction body having a multiple layer structure including at least the first metal layer for constructing the wiring and the second metal layer which functions as a carrier layer.

Furthermore, a depth of the cavity portion may be less than a thickness of the semiconductor chip to be mounted, and the cavity portion may be hollowed out at the bottom surface of the cavity portion from the center portion along a direction of a thickness of the semiconductor chip package substrate up to a depth within a range of 0.5–2.5 times a thickness of the semiconductor chip to be mounted. Alternatively, a depth of the cavity portion may be less than a thickness of the semiconductor chip to be mounted, and the cavity portion may be hollowed out at the bottom surface of the cavity portion, and the semiconductor chip package substrate may be further comprising a plastic layer formed by hardening prepregs so as to have an exposed hollowed-out bottom surface at least consisting of nonwoven fabrics.

In this case, a metal plate with a thickness of not less than 0.035 mm may be adhered to a reverse side of the plastic layer wherein the cavity portion was formed, a depth of the cavity portion may be made to be less than a thickness of the semiconductor chip to be mounted, and the bottom of the cavity portion may be hollowed out to expose the metal plate. Alternatively, a metal plate with a thickness of not less than 0.20 mm may be adhered to the reverse side of the plastic layer wherein the cavity portion was formed, a depth of the cavity portion may be made to be less than a thickness of the semiconductor chip to be mounted, and the bottom of the cavity portion may be hollowed out into the metal plate as much as the hollowed out depth in the metal plate is not less than 0.05 mm.

Furthermore, the hollow-out process of the plastic layer may be stopped before reaching the metal plate.

The above object of the present invention may be accomplished by a fabricating method of a semiconductor chip package substrate, comprising the steps of: pressing to adhere a squeeze shapeable wiring construction body to a plastic substrate, the wiring construction body consisting of all metals and having a multiple layer structure comprising at least the first metal layer and the second metal layer which functions as a carrier layer; coincidentally shaping the plastic substrate so as to form a cavity portion therein with its wall surfaces having inclination angles within a predetermined range; and removing the metal layers except the first layer; wherein the wiring, which is buried in the substrate surface and wall surface of the substrate in the cavity portion, is formed and disposed along the substrate surface and the wall surface of the substrate in the cavity portion; and the wiring comprising an external connection terminal portion for connecting to external connection terminals disposed on a surface of the substrate on a side of the cavity opening, an inner connection terminal portion for connecting to a semiconductor chip to be mounted, and a wiring portion in between the external connection terminal portion and the inner connection terminal portion.

A percentage elongation after fracture of the squeeze shapeable wiring construction body is preferred to be not less than 2%. A thickness of the carrier layer composing the squeeze shapeable wiring construction body is preferred to be within a range of 0.010–0.050 mm. A slant angle range of the wall surface of the substrate in the cavity portion is preferred to be from 5° to 40°, and a depth of the cavity portion is preferred to be at least not less than 30% of a thickness of a semiconductor chip to be mounted. The hollow-out process may be performed on the bottom surface of the cavity portion after the cavity portion is formed, and after the hollow-out process, other metal layers may be removed. Performing the hollow-out process while having the other metal layers enable to increase a process accuracy at hollowed out edges.

The above object of the present invention may be accomplished by a fabricating method of a semiconductor chip package substrate having at least one cavity portion for mounting at least one semiconductor chip and wiring, comprising the steps of: a step for making a depth of the cavity portion less than a thickness of a semiconductor chip to be mounted, and a step for hollowing out the cavity portion at the bottom surface, wherein the wiring to the semiconductor chip mounted is cut during the hollow-out process, and the cut edge portion of the wiring reaches a fringe portion of a cavity portion formed by the hollow-out process. A process accuracy at edges of the cavity portion increase.

According to the present invention, a fine pitch wiring corresponding to a connection pitch of the semiconductor chip may be disposed while forming the cavity portion which is capable of mounting the semiconductor chip, and is suitable for an area array type semiconductor package. The semiconductor package utilizing this technology is suitable for CSP (Chip Scale Package), FBGA (Fine Pitch Ball Grid Array), BGA (Ball Grid Array), LGA (Land Grid Array) or the like.

DETAILED DESCRIPTION OF THE INVENTION

Figure 1:
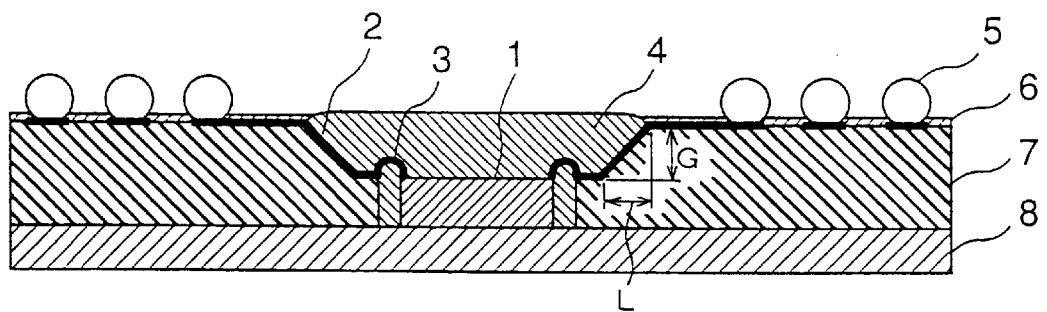
FIG. 1 is a cross sectional view showing an example of a cross sectional structure of a semiconductor package according to the present invention.

The present invention provides a semiconductor device fabrication process in which, in order to carry out vacuum pressure differential printing without causing any pressure differential short circuit, a sufficiently thick resin layer is formed by vacuum pressure differential printing by the use of a liquid resin encapsulant containing a solvent in a large quantity and the solvent is evaporated by drying after the printing so that the finished resin layer can be thin. It also provides a liquid encapsulant suited for such a process, and use of the liquid encapsulant. These will be described below in detail.

1. Solvent

The liquid resin encapsulant used in the present invention should contain the solvent in an amount of from 5 to 50% by weight, preferably from 10 to 50% by weight, more preferably from 25 to 50% by weight, and still more preferably from 25 to 40% by weight. In particular, the solvent may be in a content of from 15 to 35% by weight. If the solvent is less than 5% by weight, though a sufficiently thick resin layer can be formed, the finished resin layer can not be made thin when the solvent is evaporated by the drying after printing. Also, if the solvent is more than 50% by weight, though the finished resin layer can be made thin, a sufficiently thick resin layer can not be formed.

In order to carry out the vacuum pressure differential printing, it is essential for the solvent contained in the encapsulant to have a vapor pressure not higher than the pressure when brought under reduced pressure, thus the solvent should be as sparingly volatile as possible. Hence, in view of practical use, it is desirable to use a solvent having a vapor pressure lower than 10 mmHg, and preferably lower than 5 mmHg, at 40° C. On the other hand, a solvent having a low vapor pressure can be removed with difficulty from the liquid resin encapsulant by heating and drying the solvent. Hence, in view of readiness to dry, it is desirable to use a solvent having a vapor pressure not lower than 200 mmHg at 200° C. Also, at least part of the solvent should be a solvent capable of dissolving part or the whole of the resin contained in the liquid resin encapsulant. In order to improve the solubility of the resin in the liquid resin encapsulant and to prevent voids from being caused by any abrupt evaporation of the solvent at the time of drying, a solvent having a polarity is preferred.

As solvents that fulfill the above conditions, various ones are produced and commercially available. As examples thereof, preferred are solvents such as N,N-diethylformamide, ethylene glycol tert-butyl ether, di(isobutyl) ketone, N,N-diethylacetamide, 2-butoxyethanol, 1-methoxy-2-acetoxypropane, N,N-dimethylformamide, dipropylene glycol monomethyl ether, 2-hydroxyethyl acetate, diethylene glycol monoethyl ether, 1,2-bis(2-methoxyethoxy)ethane, 2-ethylhexyl acetate, 1,3-dimethyl-2-imidazolidinone, ethylene glycol diacetate, N,N-dimethylacetamide, bis(2-ethoxyethyl) ether, y-butyrolactone, 2-pyrrolidone, benzyl alcohol, 2-ethylhexyl alcohol, 2-(2-butoxyethoxy)ethanol, 2-(2-methoxyethoxy) ethanol, tetraethylene glycol dimethyl ether, ethylene glycol dibutyl ether, propylene glycol monobutyl ether, 1-ethoxyl-2-acetoxypropane, tripropylene glycol monomethyl ether, dipropylene glycol monobutyl ether, dipropylene glycol monoethyl ether, dipropylene glycol monopropyl ether, propylene glycol monopropyl ether, N-methylpyrrolidone, diethylene glycol dimethyl ether, ethylene glycol monobutyl ether acetate, ethyl diglycol acetate, dimethyl ether, diethylene glycol dibutyl ether, diethylene glycol ethyl methyl ether, dipropylene glycol dimethyl ether, tripropylene glycol dimethyl ether, dipropylene glycol diethyl ether, dipropylene glycol dibutyl ether, dipropylene glycol isopropyl methyl ether, and dipropylene glycol isopropyl ethyl ether.

Readily volatile solvents, having a vapor pressure not lower than 10 mmHg at 40° C., are exemplified by solvents such as cyclopentanone. Liquid resin encapsulants making use of such solvents may cause violent evaporation of the solvent at the time of vacuum pressure differential printing to make it difficult to carry out stable printing. Also, the liquid resin encapsulant may dry and harden on a mask to make it necessary to wash the mask frequently, thereby causing a poor operability in some cases. On the other hand, sparingly volatile solvents, having a vapor pressure lower than 200 mmHg at 200° C., are exemplified by solvents such as sulfolane. Liquid resin encapsulants making use of such solvents take a long time for their drying within temperatures at which the substrate or liquid resin encapsulant can be heat-resistant, and hence may be problematic in practical use.

2. Resin

There are no particular compositional limitations on the liquid resin encapsulant used in the present invention. Usually, a composition prepared by dispersing in the solvent at least one of a thermosetting resin and a thermoplastic resin, an inorganic powder such as silica powder, and other additives is used as the liquid resin encapsulant.

As the resin component of the liquid resin encapsulant used in the present invention, a thermoplastic resin may preferably chiefly be used. Thermoplastic resins preferable in the present invention may include acrylic resins, styrene resins, polyamide resins, polycarbonate resins, polyamide-imide resins and polyether-amide resins. The resin component may be a compound of a single type, or may be two or more compounds used in combination.

Of these resins, it is particularly preferable to use at least one of;

(1) a polyamide polymer obtained by condensation polymerization of an aromatic dicarboxylic acid or a reactive derivative thereof with diamine; and (2) a polyamide-imide polymer obtained by condensation polymerization of an aromatic tricarboxylic acid or a reactive derivative thereof with diamine.

The diamine used here may preferably be, but not particularly limited to, an aromatic diamine represented by the following Formula (I):

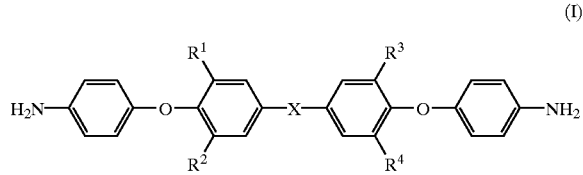

wherein $R^1$, $R^2$, $R^3$ and $R^4$ each independently represent a hydrogen atom, a alkyl group having 1 to 5 carbon atoms, a alkoxyl group having 1 to 5 carbon atoms or a halogen atom; and X represents a divalent organic group selected from any of;

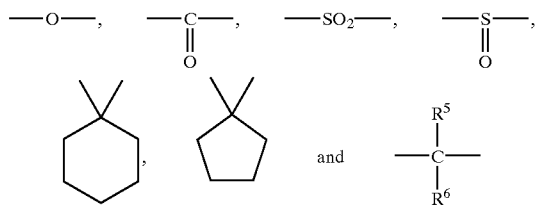

$R^5$ and $R^6$ each independently represent a hydrogen atom, a alkyl group having 1 to 5 carbon atoms, a trifluoromethyl group, or a phenyl group.

The aromatic diamine represented by Formula (I) may include, e.g., 2,2-bis[4-(4-aminophenoxy)phenyl]propane, 2,2-bis[3-methyl-4-(4-aminophenoxy)phenyl]propane, 2,2-bis[4-(4-aminophenoxy)phenyl]butane, 2,2-bis[3-methyl-4-(4-aminophenoxy)phenyl]butane, 2,2-bis[3,5-dimethyl-4-(4-aminophenoxy)phenyl]butane, 2,2-bis[3,5-dibromo-4-(4-aminophenoxy)phenyl]butane, 1,1,1,3,3,3-hexafluoro-2,2-bis[3-methyl-4-(4-aminophenoxy)phenyl]propane, 1,1-bis[4-(4-aminophenoxy)phenyl]cyclohexane, 1,1-bis[4-(4-aminophenoxy)phenyl]cyclopentane, bis[4-(4-aminophenoxy)phenyl]sulfone, bis[4-(4-aminophenoxy)phenyl]ether, bis[4-(3-aminophenoxy)phenyl]sulfone, 4,4'-carbonylbis(p-phenyleneoxy)dianiline, and 4,4'-bis(4-aminophenoxy)biphenyl. Of these, 2,2-bis[4-(4-aminophenoxy)phenyl]propane is particularly preferred.

The aromatic diamine may also include, e.g., 1,3-bis(3-aminophenoxy)benzene, 1,3-bis(4-aminophenoxy)benzene, 1,4-bis(4-aminophenoxy)benzene, 4,4'-[1,3-phenylenebis(1-methylethylidene)]bisaniline, 4,4'-[1,4-phenylenebis(1-methylethylidene)]bisaniline, 3,3'-[1,3-phenylenebis(1-methylethylidene)]bisaniline, 3,3'-[1,4-phenylenebis(1-methylethylidene)]bisaniline, 4,4'-diaminodiphenyl ether, 4,4'-diaminodiphenylmethane, 4,4'-diamino-3,3',5,5'-tetramethyldiphenyl ether, 4,4'-diamino-3,3',5,5'-tetradimethylphenylmethane, 4,4'-diamino-3,3', 5,5'-tetraethyldiphenyl ether, 2,2-[4,4'-diamino-3,3',5,5'-tetramethyldiphenyl]propane, metaphenylenediamine, paraphenylenediamine, and 3,3'-diaminodiphenylsulfone. At least one of these may be used in combination with the diamine of Formula (I).

The aromatic dicarboxylic acid is a compound to the aromatic nucleus of which two carboxyl groups are bonded. The aromatic tricarboxylic acid is a compound to the aromatic nucleus of which three carboxyl groups are bonded and two groups of the three carboxyl groups of which are bonded to the adjoining carbon atoms.

These aromatic compounds have at least one aromatic ring. The aromatic ring may be a heterocyclic ring into which a hetero atom has been introduced. When they have two or more aromatic rings, such rings may form a condensed ring, or the aromatic rings may be linked to each other through an alkylene group, an oxygen atom, a carbonyl group or the like. Into the aromatic ring, a substituent may further be introduced which does not participate in condensation reaction, as exemplified by an alkoxyl group, an allyloxy group, an alkylamino group or a halogen atom.

The aromatic dicarboxylic acid may include, e.g., terephthalic acid, isophthalic acid, diphenyl ether dicarboxylic acid-4,4', diphenylsulfonedicarboxylic acid-4,4', diphenyldicarboxylic acid-4,4', and naphthalenedicarboxylic acid-1,5. Of these, terephthalic acid and isophthalic acid are preferred as being readily available and inexpensive. In particular, use of a mixture of terephthalic acid and isophthalic acid is desirable in view of solubility of the polymer formed. Incidentally, the reactive derivative of the aromatic dicarboxylic acid in the present invention may include, e.g., dihalides as exemplified by dichloride or dibromide, or diesters, of the aromatic dicarboxylic acid.

The aromatic tricarboxylic acid may include, e.g., trimellitic acid, 3,3,4'-benzophenonetricarboxylic acid, 2,3,4'-diphenyltricarboxylic acid, 2,3,6-pyridinetricarboxylic acid, 3,4,4'-benzanilidotricarboxylic acid, 1,4,5-naphthalenetricarboxylic acid, and 2'-chlorobenzanilido-3,4,4'-tricarboxylic acid.

The reactive derivative of the aromatic tricarboxylic acid may also include, e.g., acid anhydrides, halides, esters, amides or ammonium salts of the aromatic tricarboxylic acid. These reactive derivatives may include, e.g., trimellitic acid anhydride, trimellitic acid anhydride monochloride, 1,4-dicarboxy-3-N,N-dimethylcarbamoylbenzene, 1,4-dicarbomethoxy-3-carboxybenzene, 1,4-dicarboxy-3-carbophenoxybenzene, 2,6-dicarboxy-3-carbomethoxypyridine, 1,6-dicarboxy-5-carbamoylnaphthalene, ammonium salts comprised of the aromatic tricarboxylic acid described above and amine such as ammonia, and amine salts comprised of the aromatic tricarboxylic acid described above and dimethylamine or triethylamine. Of these, trimellitic acid anhydride and trimellitic acid anhydride monochloride are particularly preferred as being readily available and inexpensive.

Any of the carboxylic acids (i.e., the aromatic dicarboxylic acid, aromatic tricarboxylic acid or reactive derivative thereof) may preferably be used in an amount of from 80 to 120 mole % in total weight, based on diamine total weight 100 mole %. Use of any of the carboxylic acids in an amount (total weight) equimolar to the diamine total weight can provide compounds having the highest molecular weight. Use of the aromatic dicarboxylic acid, aromatic tricarboxylic acid or reactive derivative thereof in an amount too large or too small based on that of diamine tends to result in a low molecular weight to lower mechanical strength, heat resistance and so forth. The polyamide polymer or polyamide-imide polymer obtained by condensation polymerization of any of the above carboxylic acids with diamine may preferably have a reduced viscosity of from 0.2 to 2.0 dl/g at 30° C. in a 0.2% by weight dimethylformamide solution. If this reduced viscosity is too low, the resultant polymer tends to have low heat resistance and mechanical strength, and if it is too high, a low solubility in solvents.

3. Fabrication of Semiconductor Device

The semiconductor device fabrication process of the present invention is a process in which a semiconductor chip is mounted on a substrate provided with a wiring, the semiconductor chip and a wiring portion of the substrate are interconnected through wires made of a conductive metal, and thereafter the semiconductor chip, the wires and the vicinity thereof are encapsulated by vacuum pressure differential printing, by printing the liquid resin encapsulant containing the solvent in an amount of from 5% by weight to 50% by weight.

The semiconductor device fabrication process of the present invention may preferably be a process in which a semiconductor chip is mounted on a substrate provided with a wiring, the semiconductor chip and a wiring portion of the substrate are interconnected through a conductive metal, and thereafter the semiconductor chip, the wire-connected portion and the vicinity thereof are encapsulated with the liquid resin encapsulant, and in which the substrate provided with a wiring has a hollow place (surface), and an external connecting terminal is disposed at its flat place, and an internal connecting terminal for interconnecting the semiconductor chip and the substrate through the conductive metal is disposed at the hollow place, so that part or the whole of connecting wires for interconnecting the semiconductor chip and the internal connecting terminal of the substrate is positioned lower than the flat place of the substrate, and also a slant is formed between the flat place and the hollow place of the substrate, where the substrate at its region provided with the wiring interconnecting the external connecting terminal and the internal connecting terminal along the slant and the semiconductor chip are encapsulated with the liquid resin encapsulant by vacuum pressure differential printing.

Figure 33A:
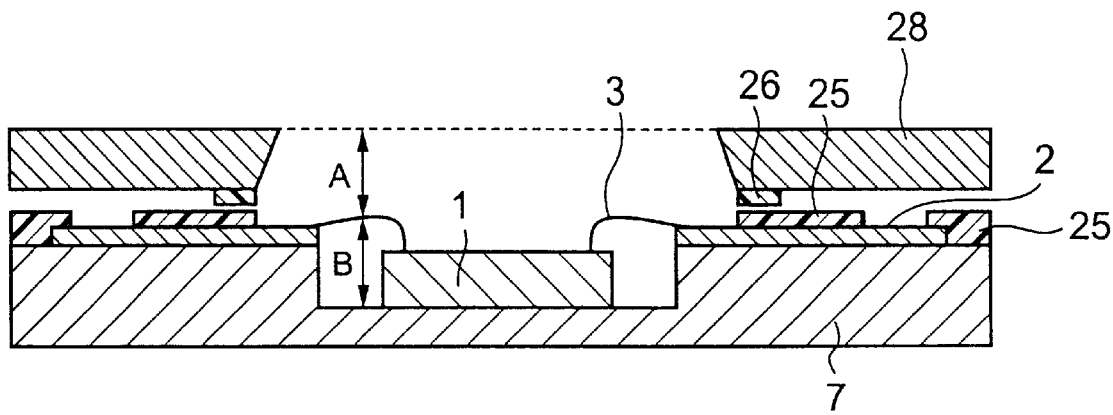
FIGS. 33A to 33C are illustrations showing that encapsulation is carried out by vacuum pressure differential printing in such a way that the thickness (A) of a resin layer lying above the apex of wires interconnecting a semiconductor chip and a wiring portion of a substrate comes to be at least 0.8 time the thickness (B) extending from the apex of the wires to the bottom of an encapsulated portion.
Figure 33B:
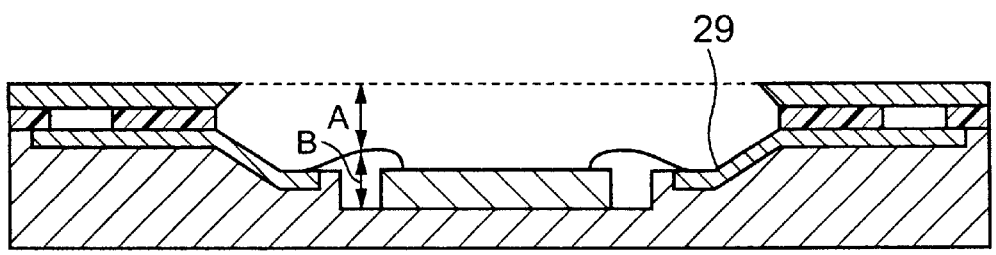
Figure 33C:
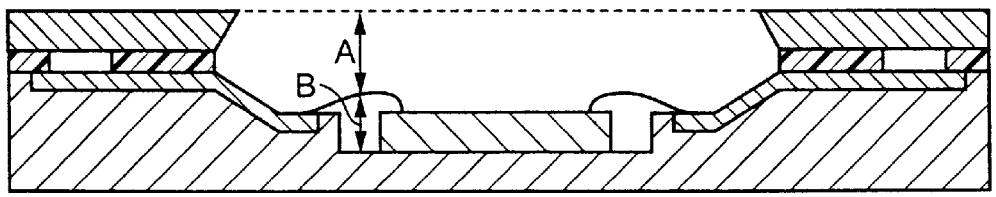

The fabrication process of the present invention may also preferably a process in which a semiconductor chip is mounted on a substrate provided with a wiring, the semiconductor chip and a wiring portion of the substrate are interconnected through a conductive metal, and thereafter the semiconductor chip, the wire-connected portion and the vicinity thereof are encapsulated with the liquid resin encapsulant, and in which encapsulation is carried out by vacuum pressure differential printing in such a way that the thickness of a resin layer lying above the apex of connected wires interconnecting the semiconductor chip and the wiring portion of the substrate comes to be at least 0.8 time the thickness extending from the apex of the connected wires to the bottom of the encapsulated portion, thereafter a printing mask is removed, and then the encapsulant is cured or dried. Vacuum pressure differential printing not causing any pressure differential short circuit can be materialized when, as shown in FIGS. 33A to 33C, A≧0.8 B is ensured.

The fabrication process of the present invention may also preferably be provided with the steps of forming a wiring conductor comprised of metal foil as a holder, bonding an insulating member to the wiring conductor (bringing the former into contact with the latter) and also forming a hollow place, and removing at least part of the metal foil. The process may further comprise the steps of preparing an insulating substrate provided with a hollow place, forming the continuous wiring conductor over the surface portion embracing the hollow place, and mounting the semiconductor chip in the hollow place.

The semiconductor device fabricated by the fabrication process of the present invention can be free of any encapsulation defects, and hence has superior resistance to moisture and resistance to temperature cycles.

4. Semiconductor Device

Figure 10:
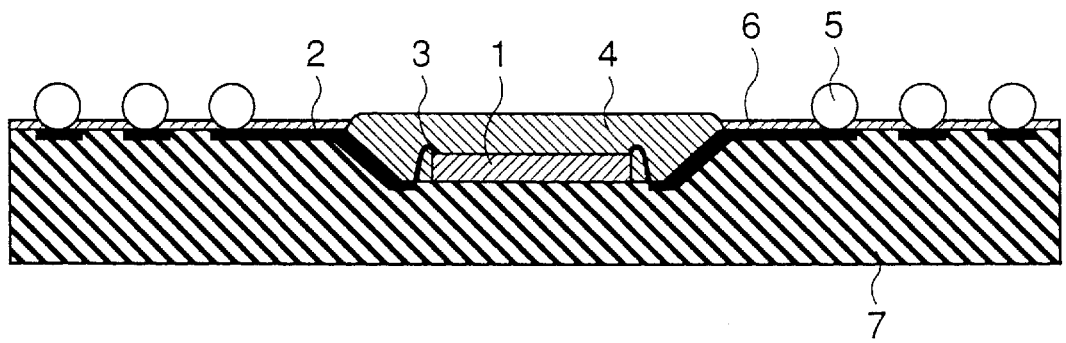
FIG. 10 is a cross sectional view showing other example of the semiconductor device according to the present invention.
Figure 11:
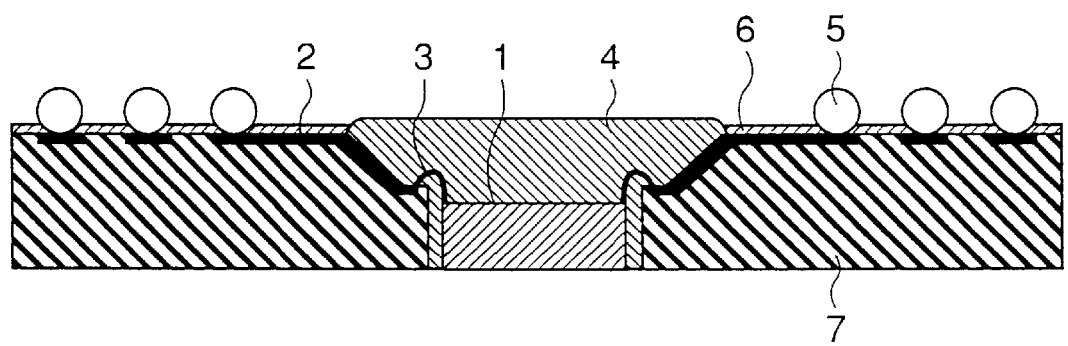
FIG. 11 is a cross sectional view showing other example of the semiconductor device according to the present invention.
Figure 12:
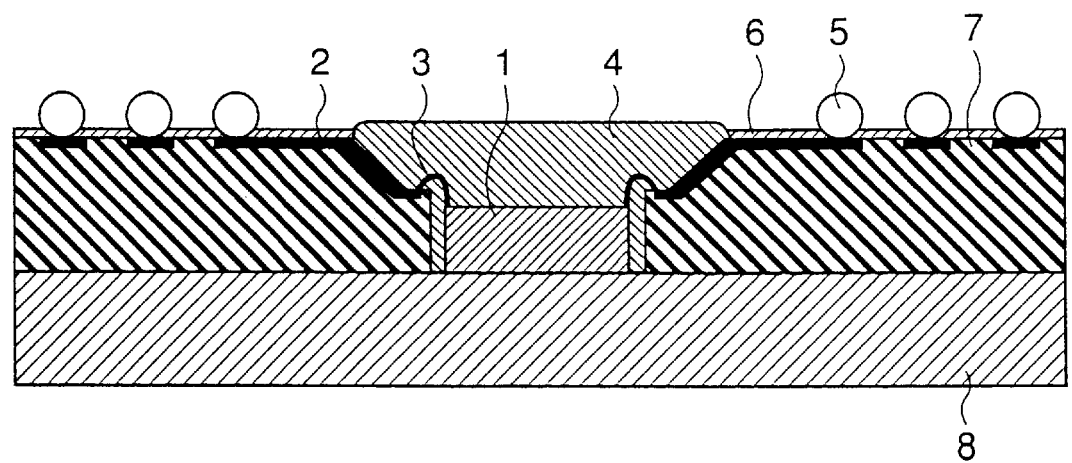
FIG. 12 is a cross sectional view showing other example of the semiconductor device according to the present invention.
Figure 13:
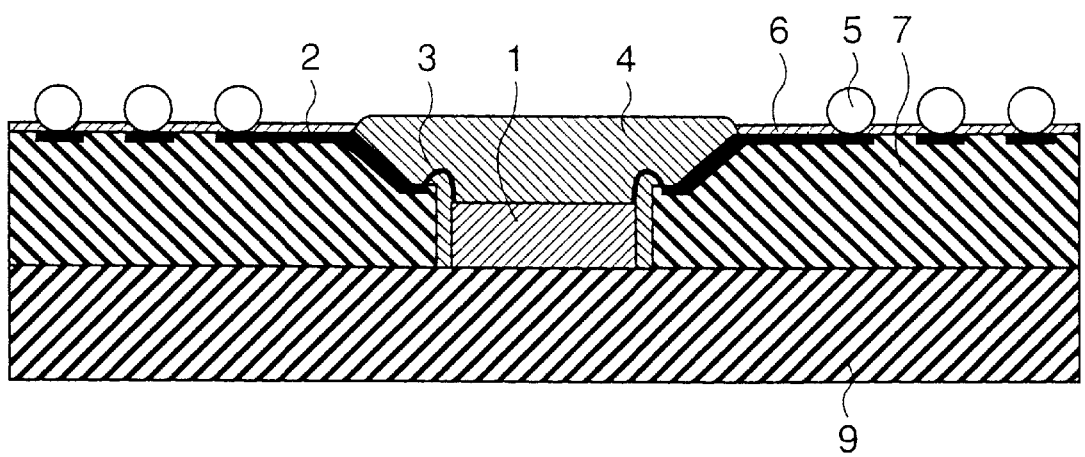
FIG. 13 is a cross sectional view showing other example of the semiconductor device according to the present invention.

In the fabrication process of the present invention, a substrate for semiconductor device may preferably be used in which as shown in FIG. 10 a wiring conductor 2 is formed continuously over the surface portion embracing a hollow place, of an insulating substrate 7, and the wiring conductor 2 and an insulating layer supporting the wiring conductor 2 are so press-molded (e.g., FIG. 7) as to form the hollow place simultaneously. The process is suited for the fabrication of a semiconductor device in which a semiconductor chip 1 is mounted in the hollow place of such a substrate. Here, the wiring conductor may preferably be formed in the state it is buried in the insulating substrate at its surface portion embracing the hollow place. The buried wiring conductor may be uncovered at its one surface, or the surface other than the part where an external connecting terminal 5 is to be formed may be covered with a surface insulating layer 6. Also, as shown in FIG. 11, the hollow place may be made up in a plurality of steps, and at least part of the hollow place may be a through-hole. Still also, the back of the substrate 7 may be covered with a metal sheet 8 (FIG. 12) or an insulating sheet 9 (FIG. 13).

Such a substrate can be produced by forming the hollow place by pressing when, after metal foil is provided with a wiring conductor, a resin layer is bonded to this metal foil. Such a substrate can also be produced by superposing and compression-bonding metal foil (provided with a wiring conductor) and a plurality of resin-impregnated glass cloths from which the part where the hollow place is to be formed has been removed. A substrate whose hollow place is formed in two steps formed of a wire bonding portion and a chip bonding portion can be produced by compressing a prepreg by means of a mold with a projection to form the first-step hollow place and then working this hollow place by cutting to form the second-step hollow place.

According to the present invention, a large number of hollow places may be provided in one sheet of substrate so that a plurality of semiconductor devices can be fabricated in one lot by mounting semiconductor chips 1 in the individual hollow places, making encapsulation with the resin 4, mounting solder balls (an external connecting terminal electrode) 5, and cutting the substrate to separate devices for each semiconductor chip.

The fabrication process of the present invention is also suited for the fabrication of a semiconductor device in which a wiring conductor formed in the surface portion of an insulating substrate constitutes an external connecting terminal portion, a wiring conductor formed in the hollow place of the insulating substrate constitutes an internal connecting terminal portion, and a terminal of a semiconductor chip and an internal connecting terminal are interconnected. Here, between the wiring conductor (external connecting terminal) formed in the surface portion of the insulating substrate and the wiring conductor (internal connecting terminal) formed in the hollow place of the insulating substrate, a ramp may preferably be formed in a height of at least 0.05 mm. According to the present invention, even when the semiconductor chip terminal and the internal connecting terminal are connected by wire bonding, the semiconductor device can be encapsulated without causing any encapsulation defects beneath wires.

The semiconductor device as described above has simple construction and can be fabricated by a simple process at a low cost. Such a semiconductor device is cross-sectionally illustrated in FIGS. 10 to 13.

THE PREFERRED EMBODIMENT

An embodiment of a semiconductor device according to the present invention will now be explained with reference to FIGS. 1–4. However, the present invention is not only limited to the following embodiment.

As shown in the figures, the semiconductor device in the present embodiment comprises a semiconductor die (semiconductor chip) 1, an insulation substrate 7 with a cavity portion or a through hole portion to mount the semiconductor chip 1, external electrodes 5 which are disposed on a surface plane of the insulation substrate 7 to establish electrical connections to the semiconductor chip 1 and outside of the device when the device is packaged, and plastic sealant 4 for sealing the cavity portion or the through hole portion after the semiconductor chip 1 is mounted therein.

The semiconductor device of the present embodiment further comprises wiring 2 for electrically connecting the semiconductor chip 1 and the external electrodes 5. The wiring 2 comprises an inner connection terminal portion connected to wires 3 for connecting the semiconductor chip 1, an external terminal portion connected to the external electrode 5, and a wiring portion disposed between the inner connection terminal portion and the external connection terminal portion. A ramp is formed between the inner connection terminal portion and the external connection terminal portion of the semiconductor device.

The wiring 2 connecting the wires 3 and the external electrodes 5 is buried continuously into a surface layer of the substrate surface portion where the external electrodes 5 are disposed, and to a surface layer of the cavity portion wall or its bottom plane. The semiconductor chip 1, the wires 3, the connection portion between the wires 3 and the wiring 2 (the inner connection terminal portion), and major parts or all parts of the wiring 2 are disposed inside the cavity portion and sealed by the plastic sealant 4.

Figure 2:
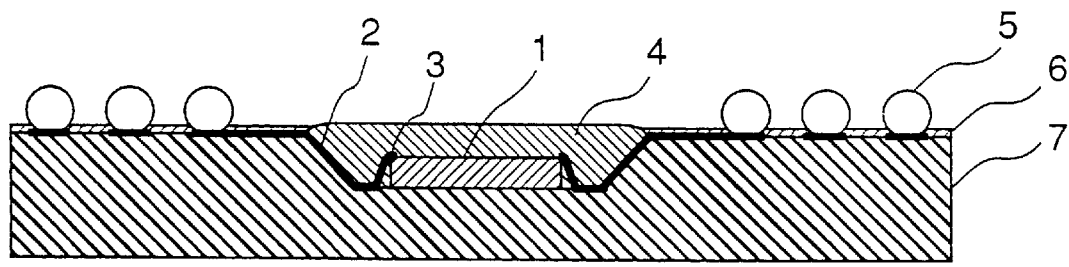
FIG. 2 is a cross sectional view showing other example of the cross sectional structure of the semiconductor package according to the present invention.
Figure 3:
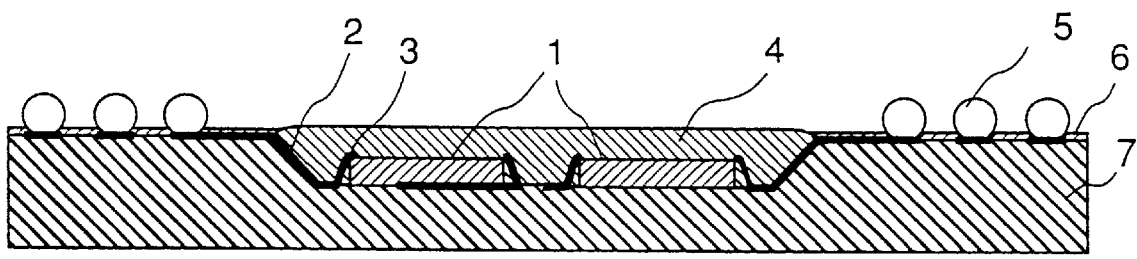
FIG. 3 is a cross sectional view showing an example of a cross sectional structure of the semiconductor package according to the present invention, in which a plurality of semiconductor chips are mounted.
Figure 4:
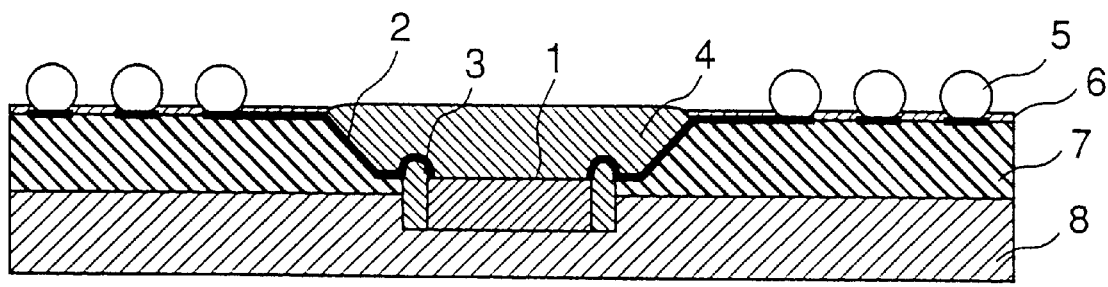
FIG. 4 is a cross sectional view showing an example of a cross sectional structure of the semiconductor package according to the present invention, having an efficient heat dissipation function.

Numeral 6 in FIGS. 1–4 indicates a surface insulation layer formed on a surface of the insulation substrate 7, and numeral 8 in FIGS. 1 and 4 indicates a metal plate disposed on the bottom surface side of the insulation layer 7.

The semiconductor device and the semiconductor chip package substrate are fabricated by pressing to adhere a squeeze shapeable wiring construction body to a plastic substrate, the wiring construction body consisting of all metals and having a multiple layer structure comprising at least the first metal layer and the second metal layer which functions as a carrier layer, coincidentally shaping the plastic substrate so as to form a cavity portion therein with its wall surfaces having inclination angles within a predetermined range, removing the metal layers except the first layer, so as to form wiring, which is buried in the substrate surface and wall surface of the substrate in the cavity portion, and disposing the wiring along the substrate surface and the wall surface of the substrate in the cavity portion, wherein the wiring comprises an external connection terminal portion for providing a connection to an external connection terminal disposed on a surface of the substrate on a side of the cavity opening, an inner connection terminal portion for providing a connection to the mounted semiconductor chip, and a wiring portion between the external connection terminal portion and the inner connection terminal portion.

When the squeeze shapeable wiring construction body is pressed and adhered to the plastic substrate, and all the metal layers except the first layer are removed, three surfaces of the first metal layer, i.e. the wiring, which were not faced to the other metal layer, are buried into the plastic substrate, and the surface which had been faced to the other metal layer is exposed at a plane coinciding a surface plane of the plastic substrate. It is assumed that the burying of the wiring is carried out in such a way described above in the present invention.

With the wiring construction body which may be squeeze-shaped, a width (a) of a wiring surface of the wiring (the first metal layer) faced to the other metal layer is larger than a width (b) of a wiring surface opposite to the wiring surface (a). In the present invention, the larger width wiring surface (a) is exposed, and this surface may be used as a terminal. Accordingly, it is possible to increase a wiring density per unit area so as to realize a higher density package.

The squeeze shapeable wiring construction body may have a multiple layer structure at least comprising the first metal layer functioning as the wiring and the second metal layer functioning as its carrier layer, or may comprise the first metal layer functioning as the wiring, which is formed from a metal foil by carrying out a half etching process using a predetermined resist pattern from a side of the metal foil, and the second metal layer functioning as its carrier layer.

When the squeeze shapeable wiring construction body is pressed and adhered to the plastic substrate, and the other metal layers except the first metal layer are removed, parts of the other metal layers may be left to form the inner connection terminal portions, the external connection terminal portions or the like, for example.

The cavity portion is press formed with a mating projected die. The semiconductor mount portion for mounting the semiconductor chip 1 is embodied by the cavity portion itself or by hollowing the cavity portion out further. There, the cavity portion may be formed from a plurality of cavities.

A depth of the semiconductor chip mount portion formed from the cavity portion itself or by further hollowing the cavity portion out may preferably be larger than a thickness of the semiconductor chip 1 to be mounted.

If the cavity portion should be hollowed out further, the other metal layer (the carrier layer) may be removed after the hollowing-out process.

A slant angle of a slant portion wherein the wiring 2 is disposed in the present embodiment may be set to a value within a predetermined angle range which is set in correspondence with fabricating conditions in the fabricating method of the semiconductor device described in detail hereafter.

Concretely, the slant angle of the wall surface of the cavity portion may be set to a value within a range between 5 and 40 degrees. More preferably, the value may be set within a range between 5 and 25 degrees, and further preferably the value may be set within a range between 5 and 18 degrees. The slant angle may be determined according to not only a shape of the die used for the press forming but also physical characteristics of the wiring construction body (transfer metal foil) which may be squeeze-shaped and used for fabricating the wiring 2, or fabricating conditions during the cavity portion press forming, or the like. The slant angle here means the maximum slant angle.

The slant portion may also be characterized by a height of the slant portion G and a horizontal length L (see FIG. 1). As to the slant portion of the semiconductor device of the present embodiment, a ratio $L/G$ may be set within a range $1.5 < L/G < 10$. More preferably the ratio $L/G$ may be set within a range $2 < L/G < 10$, and the most preferably $3 < L/G < 10$.

Furthermore, a height of the ramp is preferably 30% of a thickness of the semiconductor chip 1 to be mounted. Typically, the thickness of the semiconductor chip 1 is in a range between 0.2 and 0.5 mm. Accordingly, the ramp height should be at least in a range between 0.06 and 0.15 mm.

The ramp height may be varied in accordance with a height of the external electrodes 5. When solder balls are used as the external electrodes 5 as shown in FIGS. 1–4, a margin in the ramp height may be varied in accordance with a size of the solder ball. For example, if a diameter of the solder ball is about 0.7 mm, the sufficient distance between the package and the mother board may be accommodated with utilizing a low profile wire bonding process and keeping a height of the plastic 10 sealant 4 to less than about 0.2 mm. It will be difficult to provide the sufficient distance between the package and the mother board without the cavity portion if the diameter of the solder ball is less than 0.4 mm.

Furthermore, it is necessary to dispose a wire bonding connection portion inside the cavity portion for LGA (Land Grid Array) without using the solder balls.

Corner portions are the most easily breakable part when the ramp of a square or rectangular shape is fabricated in the insulation substrate 7 for mounting the semiconductor chip 1.

The corner portions may be largely deformed even if it were not broken. Accordingly, it is preferable not to have the wiring at the corner portion since it may cause some troubles in a long term and lower the reliability if the wiring is disposed in the corner section. If the wiring should be disposed in the corner section, it may be preferable to make the corner section round.

Furthermore, the semiconductor chip 1 may be mounted in the cavity portion of the insulation substrate 7 in such a way that the mounted semiconductor chip 1 is positioned at the center portion of the substrate in a direction along its thickness. Accordingly, a warp of the semiconductor device when heat cycles are applied may be controlled under a smaller value.

When the semiconductor chip is offset mounted from the center portion, a substantial reliability, which is related to a rigidity of the substrate and an amount of cure shrinkage of the plastic sealant, may be ensured up to an offset amount of 30% of the substrate thickness.

The mount portion for mounting the semiconductor chip 1 may be formed not only by the press forming of the cavity portion but also by hollowing out an additional cavity inside the cavity portion as shown in FIGS. 1 and 4 so as to fabricate various types of the semiconductor chip package substrates. The hollow out process is widely used in a print wiring board industry. An end mill device may be used to conduct the hollow out process mechanically while controlling machining dimensions precisely in XYZ directions.

In the present embodiment, a depth of the hollowed out cavity is required to be set within a range between 0.5 times and 2.5 times the thickness of the chip to be mounted. This is related to how easily the wire bonding connection can be fabricated. In a low loop wire bonding with a lower profile, it is preferred to have less height difference between a chip side bonding location and a substrate side bonding location.

A surface condition of the hollowed out plane affects the adherence nature with the semiconductor chip 1 and with the plastic sealant 4. When the substrate 7 for mounting the semiconductor chip 1 is fabricated from continuous glass fiber of a fabric type, the glass fiber and the plastics may be detached at the hollowed out plane. A wettability with the plastic sealant or die bonding plastic is low at the hollowed out plane, and the adhesive force is weaker in such a case. When nonwoven fabric is used, the hollowed out plane becomes smooth since the nonwoven fabric is composed of short glass fibers. Accordingly, the wettability with the plastic sealant or die bonding plastic is high at the hollowed out plane, and thus the adhesive force is stronger. The fabricating method will be described in detail in the following.

Furthermore, the substrate may be fabricated by forming the wiring and a cavity portion at the center portion of the insulator substrate 7 with an insufficient depth for mounting the semiconductor chip, hollowing out the cavity portion further, and cutting a part of the wiring 2 during the hollow out process so as that the end portion of the wiring 2 may reaches the brink of the cavity portion formed by the hollow-out process.

Furthermore, as shown in FIG. 3, the substrate may be fabricated by forming the wiring 2 and a cavity portion, wherein a plurality of components may be mounted, at the center portion of the insulator substrate 7 so as to mount a plurality of semiconductor chips and/or passive elements in the cavity portion. The wiring 2 may be used for wiring between the semiconductor chips within the cavity portion, and between inside and outside of the cavity portion.

Furthermore, a metal portion which can be functioned as a heat dissipation layer or the like may be simultaneously integrated into one body when a metal plate is placed at the bottom side during the press forming of the cavity portion.

Furthermore, as shown in FIG. 4, the substrate may be fabricated by hollowing out the insulator substrate 7 with the metal plate 8 attached to the bottom side so as to expose a metal surface at the bottom plane of the cavity portion. It is necessary to cut into the metal plane when the end mill is used in the hollow out process to expose the metal layer surface. Accordingly, the metal plate 8 is required to have an sufficient thickness. If a thin metal plate should be used, it will be difficult to make a substantial compensation with an order of precession comparable to a thickness of the plate during the end mill machining. However, it will be possible to fabricate such a substrate by utilizing a laser beam machining or plasma machining or plastic etching, or utilizing these process with the end mill machining. Alternatively, the substrate may be fabricated by hollowing through the substrate at a portion need to be hollowed out and adhering another substrate or a metal plate.

EXAMPLES

Methods of fabricating the semiconductor device in the present embodiment will now be explained with reference to FIGS. 5–8.

Example 1

Figure 5:
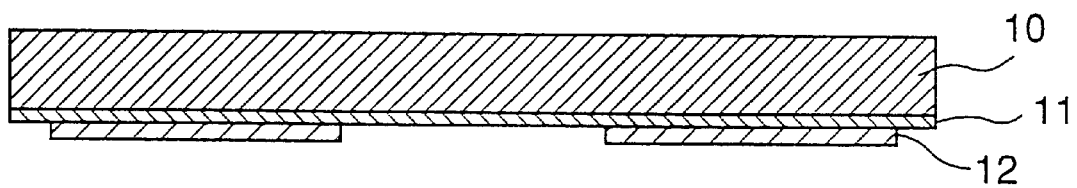
FIG. 5 is a cross sectional view showing an example of a cross sectional structure of a wiring construction body which is composed of all metals and can be squeeze-shaped.
Figure 6:
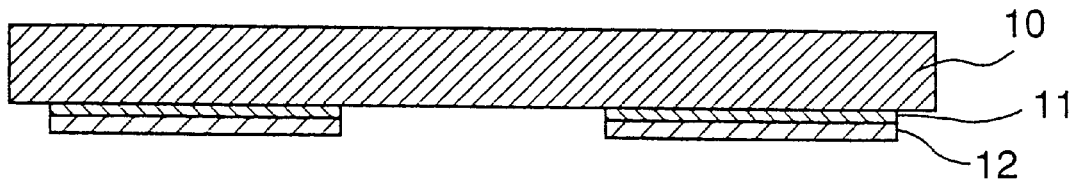
FIG. 6 is a cross sectional view showing other example of the cross sectional structure of the wiring construction body which is composed of all metals and can be squeeze-shaped.

In the instant example of the fabricating method, a three layer structure foil is utilized as a transfer metal foil for fabricating wiring which may comprise the wiring 2 as shown in FIG. 5 or FIG. 6 for example. The three layer structure foil is formed by plating a 0.5 $\mu$m thick nickel layer 11 over a 35 $\mu$m copper foil 10 (carrier foil) and further forming a 5 $\mu$m copper layer 12 thereon. This copper foil is fabricated by NIHON DENKAI Co.

The transfer metal foils having structures other than the instant example may be also used in the present invention as long as it comprises from all metal substances and includes no plastic. Namely, the transfer metal foil is preferred to have at least a carrier layer (the copper foil 10 in the instant example) and a wiring layer (the copper layer 12 in the instant example). When the same type of metal is used for the carrier layer and the wiring layer, a barrier layer (the nickel alloy 11 in the instant example) comprising the different type of metal should be provided between the layers. The carrier layer will be removed by etching in later process. A part of the carrier layer may be left unremoved so as to utilize the remaining part of the carrier layer as terminals.

The transfer metal foil is required to have a percentage elongation after fracture of not less than 2% (and preferably not more than 100%) within a process temperature range (press temperatures of 150–250° C). A thickness of the carrier layer of the transfer metal foil should be within a range between 0.010–0.050 mm. Handling of the transfer metal foil may become difficult if the carrier layer is thinner than the above range, and shaping in accordance with the die may become difficult if the carrier layer is thicker than the above range. A surface of the carrier layer, a side of which the wiring layer is not formed, may be etched over the whole surface area to make the carrier layer thinner just before the press shaping of the transfer process.

In the instant example, the copper layer 12 with 5 μm thickness is employed as the wiring material, and is etched after forming a resist pattern with a conventional photo-resist method. The etching solution is needed to have a selectivity for etching only copper and not nickel. Alkali etchants which are widely used in the print board industry are preferred as the etching solution. The carrier layer with 35 μm thickness is protected by the resist from being etched.

Figure 7:
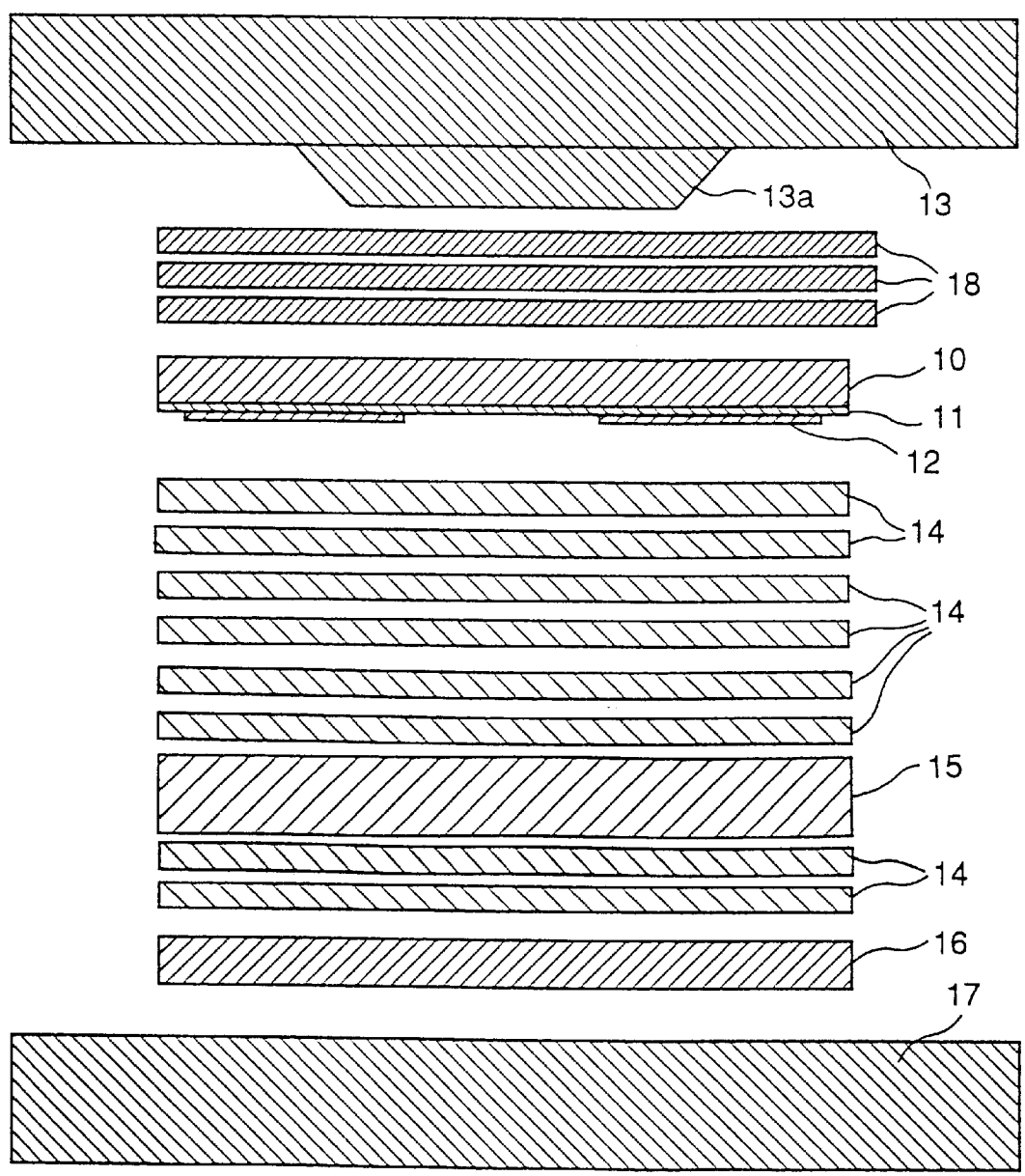
FIG. 7 is an explanatory view illustrating an example of material compositions for press shaping wherein nonwoven fabric prepregs are included in the material composition.

The patterned copper foils 10–12 are heat pressed in an arrangement shown in FIG. 7 for two hours at a temperature of 180° C. and a pressure of 25 kg/cm$^2$. FIG. 7 illustrates the arrangement between the press shaping upper die 13 and the press shaping lower die 17, where a plurality of aluminum foils 18, the patterned copper foil with the three layer structure (copper foil 10, nickel alloy 11, copper wiring 12), a plurality of glass fabric prepregs 14, nonwoven prepreg 15, the glass fabric prepreg 14 and the copper foil 16 functioned as the metal plate are arrayed from top to bottom of the figure.

A cross sectional shape of a projected part 13a of the press shaping upper die 13 is trapezoidal, and its height is 0.15 mm and a slant angle of its side surfaces is 45°. Three aluminum foils 18, each with a thickness of 25 μm, are placed in between the die and the copper foil 16 so as to provide a cushion layer during the press shaping process. The prepregs, which are fabricated by Hitachi Chemical Co., Ltd. by impregnating heat resist epoxy into glass fabric or the like, are used.

In the instant example, eight pieces of the glass fabric prepregs 14 each with 0.1 mm thickness are used in total. Furthermore, a piece of the glass fiber nonwoven prepreg 15 with 0.2 mm thickness is used. The nonwoven prepreg is placed between the sixth and seventh piece of the glass fabric prepregs. A glass epoxy substrate fabricated under the conditions described above contains a plurality of device units, each comprising the same wiring and the same cavity portion. The carrier copper foil 10 of the glass epoxy substrate is etched by the alkali etchant described above to remove the carrier copper foil 10 from the whole surface area, and then the nickel layer 11 is etched away by an etching solution for selectively etching nickel.

According to the above mentioned conditions, the cavity portions each with 0.15 mm depth are formed in the substrate with 1.0 mm thickness, and the continuous wiring is disposed at the surface layers including surfaces of the cavity portions. The cavity portions of the substrate are further milled to a depth of 0.55 mm by the end milling machine for adjusting the depth so as to be able to mount the semiconductor chips. Solder resist layers are formed using a conventional method, and 5 μm thickness of nickel and 0.5 μm thickness of gold are plated at the terminal portions.

The semiconductor chips 1 of 0.28 mm thickness are adhered in the cavity portions, and connected by the wire bonding. The semiconductor chip 1 and the wire bonding portion (wires 3 and the inner connection terminal portion of the wiring 2) are sealed by the plastic sealant 4. After the solder balls 5 are attached, the substrate is diced and separated by the unit to complete the fabrication of the semiconductor device.

According to the fabricating method described above, the structure shown in FIG. 1 may be obtained, for example. Such a construction enables to fabricate a comparatively smaller package which is closer to the chip size, the chip scale package.

Example 2

The three layer structure foil, formed by plating a 0.5 μm thick nickel layer over a 35 μm copper foil (carrier foil) and further forming a 5 μm copper layer, is also used in the instant example of the fabricating method. The copper foil is made by NIHON DENKAI Co.

The copper layer with 5 μm thickness is etched after forming a resist pattern with a conventional photo-resist method. The etching solution is needed to have a selectivity for etching only copper and not nickel. Alkali etchants which are widely used in the print board industry are preferred. The carrier layer with 35 μm thickness is protected by the resist from being etched.

Figure 8:
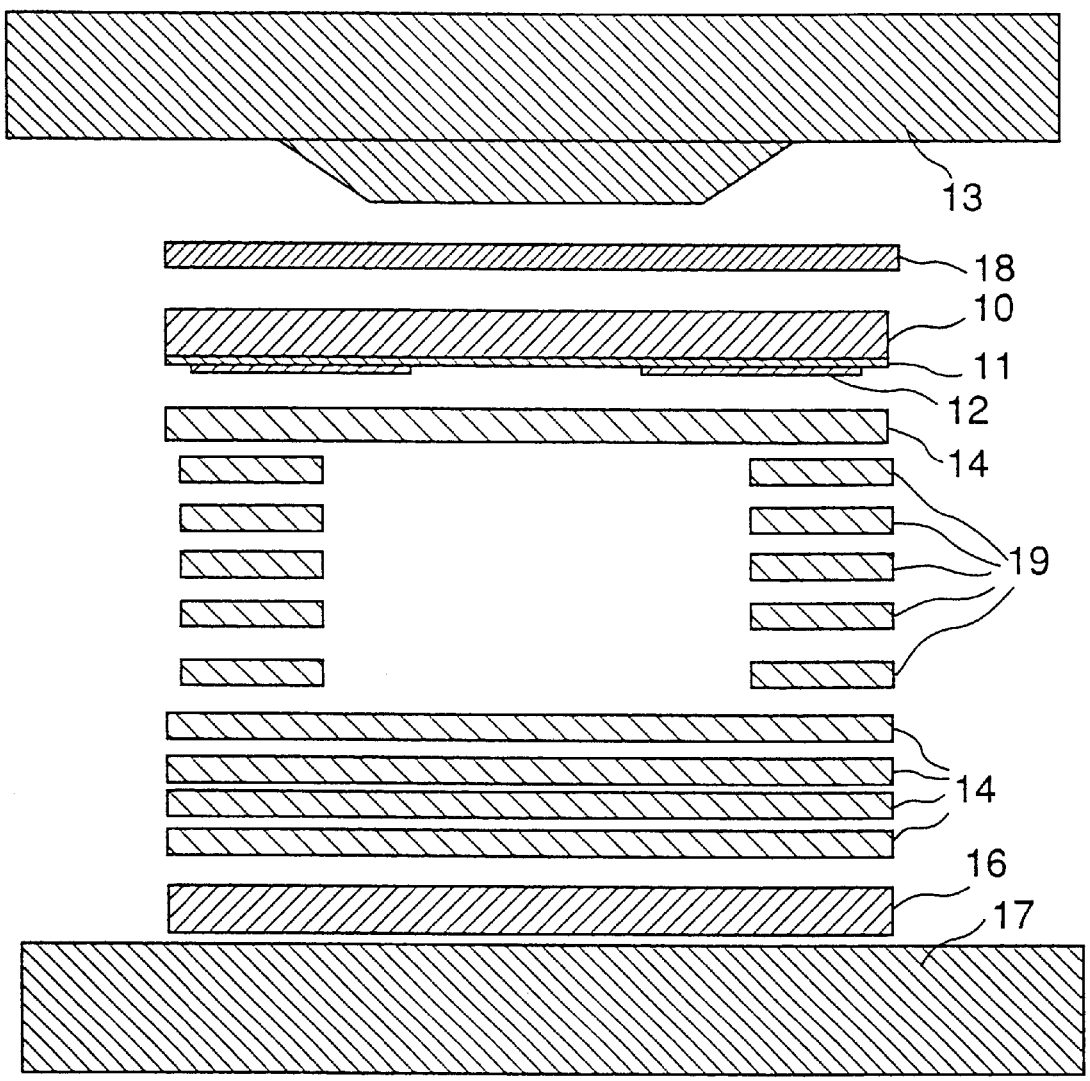
FIG. 8 is an explanatory view illustrating an example of material compositions for press shaping wherein bored through prepregs are included in the material composition.

The patterned copper foils comprising the copper foil 10, the nickel alloy 11 and the copper layer 12 are heat pressed in the arrangement shown in FIG. 8 for two hours at a temperature of 180° C. and a pressure of 25 kg/cm$^2$. FIG. 8 illustrates the arrangement between the press shaping upper die 13 and the press shaping lower die 17, where an aluminum foil 18, the patterned copper foils in the three layer structure (copper foil 10, nickel alloy 11, copper wiring 12), a glass fabric prepreg 14, a plurality of prepregs 19 having hollowed through portions, a plurality of glass fabric prepregs 14, and the copper foil 16 functioning as the metal plate are arrayed from top to bottom of the figure.

A height of a projected part of the press shaping upper die 13 is 0.5 mm and a slant angle of its side walls is 30°. A piece of the aluminum foil with a thickness of 25 μm is placed in between the die and the copper foil so as to provide a cushion layer during the press shaping process.

The prepregs fabricated by Hitachi Chemical Co., Ltd. by impregnating heat resist epoxy into glass fabric or the like are used. The prepregs are hollowed out at positions corresponding to the projected portions of the upper die 13. These hollowed-out prepregs are piled so many layers as to make the total thickness of the hollowed-out prepregs comparable to the height of the projected portion. In the instant example, five pieces of the hollowed-out prepregs with 0.1 mm thickness and five pieces of the prepregs without a hole are used for the projected portion of 0.5 mm height.

The glass epoxy substrate fabricated by the conditions described contains a plurality of device units, each comprising the same wiring and the same cavity portion. The carrier copper foil 10 of the glass epoxy substrate is etched by the alkali etchant described to remove the carrier copper foil 10 from the whole surface area, and then the nickel layer 11 is etched away with an etching solution for selectively etching nickel.

According to the above mentioned conditions, cavity portions of 0.5 mm depth are formed on the substrate of 1 mm thickness, and the continuous wiring is buried at the surface layer including surface planes in the cavity portions. Solder resist layers are formed using a conventional method, and layers of a 5 μm thick nickel and a 0.5 μm thick gold are plated at the terminal portions. The semiconductor chips 1 are adhered in the cavity portions, and connected by the wire bonding. The chip and the wire bonding portion are sealed by the plastic sealant 4. After the solder balls 5 are attached, the substrate is diced and separated by the device unit to complete the fabrication of the semiconductor device.

According to the fabricating method described above, the structure in which the metal plate is attached at the bottom side of the substrate as shown in FIG. 2 or 3, may be embodied, for example. Such a structure enables to decrease the fabricating cost since no hollow out process is required though the package size becomes larger. This is due to longer slant portions with less slant angle. Furthermore, there is a merit of being able to mounting a plurality of the chips and simultaneously form the wiring between the chips, as shown in FIG. 3.

Example 3

The three layer structure foil, formed by plating a 0.5 μm thick nickel layer over a 35 μm copper foil (carrier foil) and further forming a 5 μm copper layer, is used in the instant example of the fabricating method. The copper foil is fabricated by NIHON DENKAI Co.

The copper layer with 5 μm thickness is etched after forming a resist pattern with a conventional photo-resist method. The etching solution is required to have a selectivity for etching only copper and not nickel. Alkali etchants which are widely used in the print board industry are preferred. The carrier layer with 35 μm thickness is protected by the resist from being etched.

Figure 9:
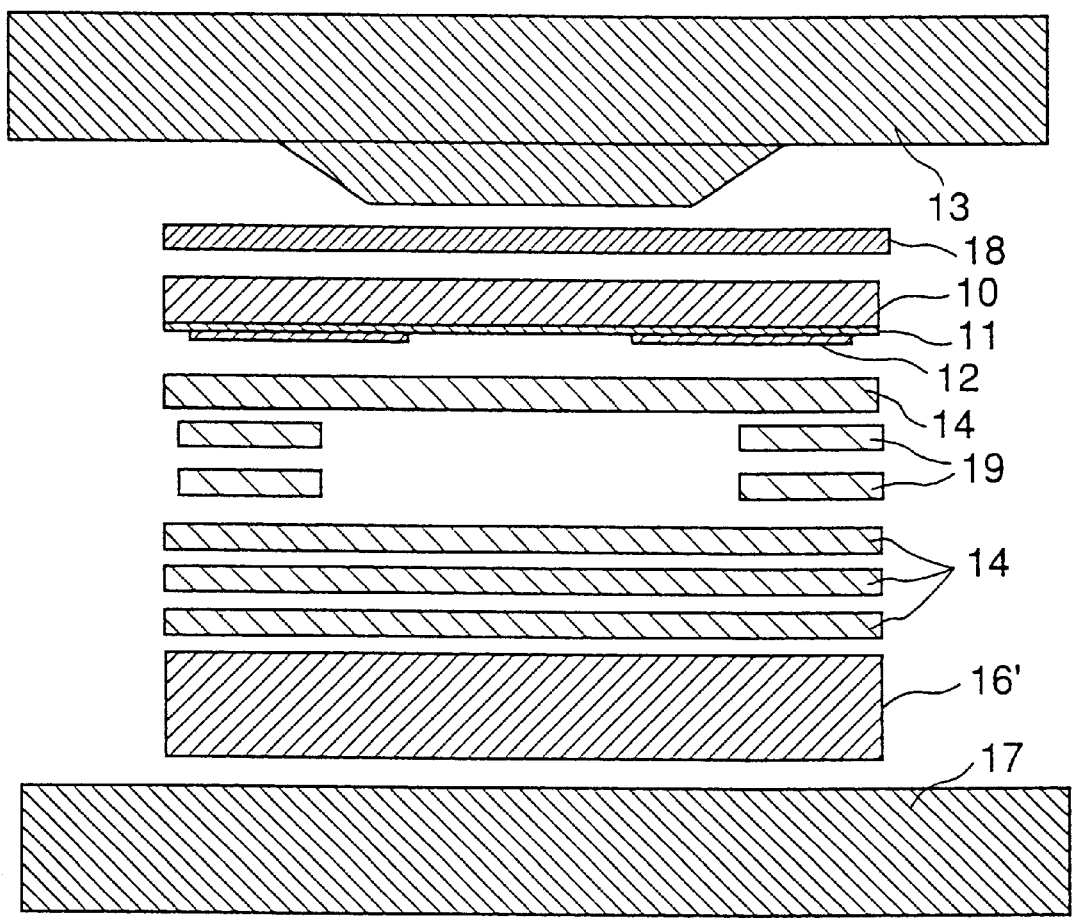
FIG. 9 is an explanatory view illustrating an example of material compositions for press shaping to fabricate an efficient heat dissipation type with a metal plate adhered to the back surface.

The patterned copper foils are heat pressed in the arrangement shown in FIG. 9 for two hours at a temperature of 180° C. and a pressure of 25 kg/ cm². FIG. 9 illustrates the arrangement between the press shaping upper die 13 and the press shaping lower die 17, in which an aluminum foil 18, the patterned copper foils with the three layer structure (copper foil 10, nickel alloy 11, copper wiring 12), a plurality of glass fabric prepregs 14, 19, and a copper plate 16' as the metal plate are arrayed from top to bottom of the figure.

A height of a projected part of the die is 0.20 mm and a slant angle of its side walls is 30°. A piece of the aluminum foil 18 with a thickness of 25 μm is placed in between the die and the copper foil to provide a cushion layer during the press shaping process.

Six pieces of the prepregs, which is fabricated by Hitachi Chemical Co., Ltd. by impregnating heat resist epoxy into glass fabric or the like, with a thickness of 0.1 mm are used. The second and third prepregs 19 are hollowed out at positions corresponding to the projected portions of the upper die 13. Furthermore, the copper plate of 0.40 mm thickness, to which an adhesion roughing process is carried out, is disposed in the bottom side of the substrate, and the press forming process is executed. The total thickness after the press forming process is 1.0 mm.

The glass epoxy substrate fabricated by the conditions described above comprises a plurality of device units each comprising the same wiring and the same cavity portion. The carrier copper foil 10 of the glass epoxy substrate is etched by the alkali etchant described above to remove the carrier copper foil from the whole surface area, and then the nickel layer is etched away by an etching solution for selectively etching nickel.

According to the above mentioned conditions, the cavity portions of 0.20 mm depth are formed in the substrate with 1 mm thickness, and the continuous wiring is disposed at the surface layer including surface planes of the cavity portions. The substrate is milled further by an end milling machine up to 0.65 mm depth for mounting semiconductor chips. Solder resist layers are formed using a conventional method, and layers of 5 μm thickness of nickel and 0.5 μm thickness of gold are plated at the terminal portions.

The semiconductor chips 1 are adhered in the cavity portions, and connected by the wire bonding. The chip and the wire bonding portion are sealed by the plastic sealant 4. After the solder balls 5 are attached, the substrate is diced and separated by the device unit to complete the fabrication of the semiconductor device.

According to the fabricating method described above, the structure shown in FIG. 4 may be obtained, for example. Such a structure enables to decrease the fabricating cost and attain high reliability since the heat dissipation plate may be attached to the substrate during the same press forming process.

According to the first to third examples, it is possible to provide a semiconductor chip package substrate for mounting a semiconductor chip(s) and a method of fabricating the semiconductor chip package substrate, and a semiconductor device wherein a semiconductor chip(s) is mounted on the semiconductor chip package substrate, those of which enable to reduce the size, increase the reliability, reduce the cost, and make the standardization of design and fabricating process easier.

Next, other embodiments of the semiconductor device, the substrate and the fabricating method of the present invention are now explained with reference to FIGS. 10–16.

The semiconductor device of the present embodiment is fabricated by forming cavity portions at parts of a wiring substrate and mounting semiconductor chips in the cavity portions. In the semiconductor device, continuous wiring conductors are buried in a surface layer of the wiring substrate, which includes surfaces of the cavity portions.

Concretely, as shown in FIG. 10, for example, the wiring substrate having two or more than two surface layers with different heights is formed by providing an external connection terminal portion connecting to the external connection terminal 5 in the first surface layer, providing an inner connection terminal portion connecting to the semiconductor chip 1 on the second surface layer, providing a ramp with a height not less than 0.05 mm between the first and second layers, and burying the continuous wiring conductors on the first surface layer, the second surface layers and surface layers in between.

The wiring substrate may be embodied by the fabricating method wherein the wiring conductor is formed on a metal foil such as copper or the like, and the metal foil is adhered to the plastic layer at the same time the cavity portion is formed.

The wiring substrate may be also embodied by a fabricating method of the wiring substrate with the cavity portion by pressing a pile of glass fabrics impregnating the plastic and the metal foil comprising the wiring conductor, wherein parts of the glass fabrics corresponding to the cavity portions are removed prior to the pressing process.

In another example of the present embodiment of the wiring substrate with the cavity portion, the wiring substrate and its fabricating method, wherein the cavity portion is formed into two step sections, one for the wire bonding portion and the other for the chip adhesion portion, are provided as shown in FIG. 11, for example. In a method for forming the two step cavity portion, the first cavity step is fabricated by press forming the prepregs using a die with a projected portion, and the second cavity step by the milling.

The semiconductor device may be fabricated by forming a plurality of the cavity portions on single wiring substrate, adhering chips on each cavity, sealing with the plastic, attaching the solder balls, and dicing to separate each device.

FIGS. 10–13 are cross sectional figures showing typical semiconductor devices in the present embodiment.

Numeral 1 in the figures indicates the semiconductor chip, 2 indicates the wiring, 3 indicates the wire, 4 indicates the plastic sealant, 5 indicates the external terminal electrode, 6 indicates the surface insulation layer, 7 indicates the insulation substrate, 8 indicates the metal plate, and 9 indicates the insulation plate.

A part of the cavity portion shown in FIG. 11 may comprises a through hole. As shown in FIGS. 12, 13, the metal plate 8, the insulation plate 9 may be used as a support at the bottom side of the semiconductor device.

Example 4

An example of the fabricating method of the semiconductor device in the present embodiment will now be explained with reference to FIG. 14.

A three layer structure foil, formed by plating a 0.5 $\mu$m thick nickel layer 11 over a 35 $\mu$m copper foil 10 (carrier foil fabricated by NIHON DENKAI Co.) and further forming a 5 $\mu$m copper layer, is prepared. The copper layer with 5 $\mu$m thickness is etched after forming a resist pattern with a conventional photo-resist method so as to form the wiring conductor 12.

The etching solution is required to have a selectivity for etching only copper and not nickel. Alkali etchants which are widely used in the print board industry are preferred. The carrier layer with 35 $\mu$m thickness is protected by the resist from being etched.

Figure 14:
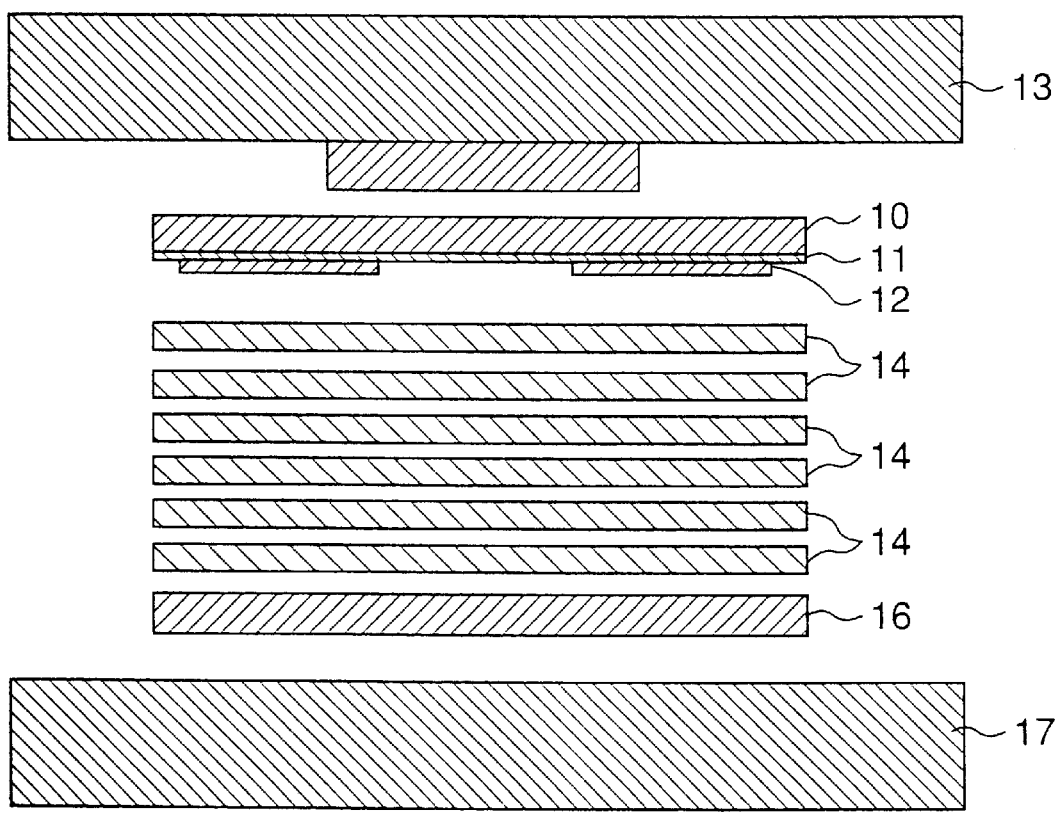
FIG. 14 is a cross sectional view showing other example of the fabricating method (press configuration) of the semiconductor device according to the present invention.

The copper foils with the pattern (wiring conductor 12) are heat pressed in the arrangement shown in FIG. 14 for two hours at a temperature of 180° C. and a pressure of 25 kg/cm$^2$. A projected portion of the die 13 has a height of 0.15 mm with a slant angle of 90°. Sheets of teflon (Dupont Co.) with a thickness of 50 $\mu$m, which is not shown in the figure, are placed in between the dies 13, 17 and copper foils 10, 16 to provide cushion layers during the press shaping process.

Prepregs (without holes), which are fabricated by Hitachi Chemical Co., Ltd. by impregnating heat resist epoxy into glass fabric are used.

A glass epoxy substrate fabricated by the conditions described above contains a plurality of units each comprising the same wiring and the cavity portion. The carrier copper foil of the glass epoxy substrate is etched by the alkali etchant described above to remove the carrier copper foil from the whole surface area.

Next, the nickel layer is etched away by an etching solution for selectively etching nickel. According to the above mentioned conditions, the cavity portions of 0.15 mm depth are formed in the substrate with 1 mm thickness, and the continuous wiring is disposed on the surface layer including surface planes of the cavity portions. The substrate is milled further by a milling machine up to 0.5 mm depth for mounting the semiconductor chips 1, and diced to separate each unit. The semiconductor chip 1 is adhered in the cavity portion, and connected by the wire bonding. The semiconductor chip 1 and the wire bonding portion are sealed with liquefied plastic sealant to complete the semiconductor device.

Example 5

Another example of the fabricating method of the semiconductor device in the present embodiment will now be explained with reference to FIG. 15.

Figure 15:
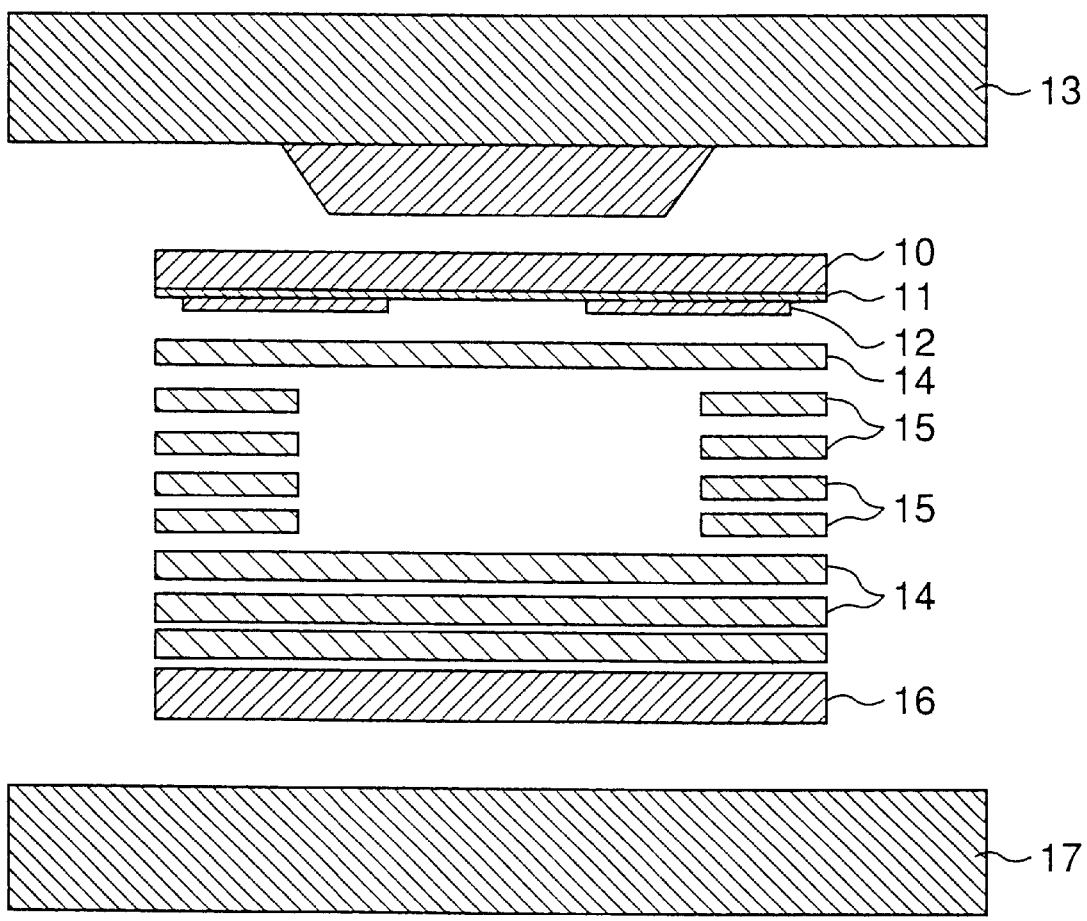
FIG. 15 is a cross sectional view showing other example of the fabricating method (press configuration) of the semiconductor device according to the present invention.

A patterned copper foil 10 with the similar construction as that of the example shown in FIG. 14 is heat pressed in the arrangement shown in FIG. 15 for two hours at a temperature of 180° C. and a pressure of 25 kg/cm$^2$. In the instant example, a projected portion of the die 13 has been fabricated to have a height of 0.5 mm with a slant angle of 45°.

Sheets of teflon (Dupont Co.) with a thickness of 50 $\mu$m, which is not shown in the figure, are placed in between the die/die 13, 17 and copper foils 10, 16 as cushion layers during the press shaping process.

Prepregs 14 fabricated by Hitachi Chemical Co., Ltd. by impregnating heat resist epoxy into glass fabric are used. The prepregs 15 are hollowed out at positions corresponding to the projected portion of the die 13, and piled so many layers as to make the total thickness of the hollowed-out prepregs comparable to the height of the projected portion.

In the instant example, five pieces of the hollowed-out prepregs 15 with 0.1 mm thickness and five pieces of the prepregs 14 without a hole are used for the projected portion of 0.5 mm height. A glass epoxy substrate fabricated by the conditions described above contains a plurality of units each comprising the same wiring and the cavity portion. The carrier copper foil of the glass epoxy substrate is etched by the alkali etchant described above to remove the carrier copper foil from the whole surface area, and then the nickel layer is etched away by an etching solution which selectively etches nickel.

According to the above mentioned conditions, the cavity portions of 0.5 mm depth are formed in the substrate with 1 mm thickness, and the continuous wiring is disposed at the surface layer including surface planes of the cavity portion. The semiconductor chips 1 are adhered in the cavity portions, and connected by the wire bonding. The semiconductor chip 1 and the wire bonding portion are sealed with liquefied plastic sealant. After solder balls 5 are attached, the substrate is diced and separated by each device unit to complete the fabrication of the semiconductor device.

Example 6

Another example of the fabricating method of the semiconductor device in the present embodiment will now be explained with reference to FIG. 16.

Figure 16:
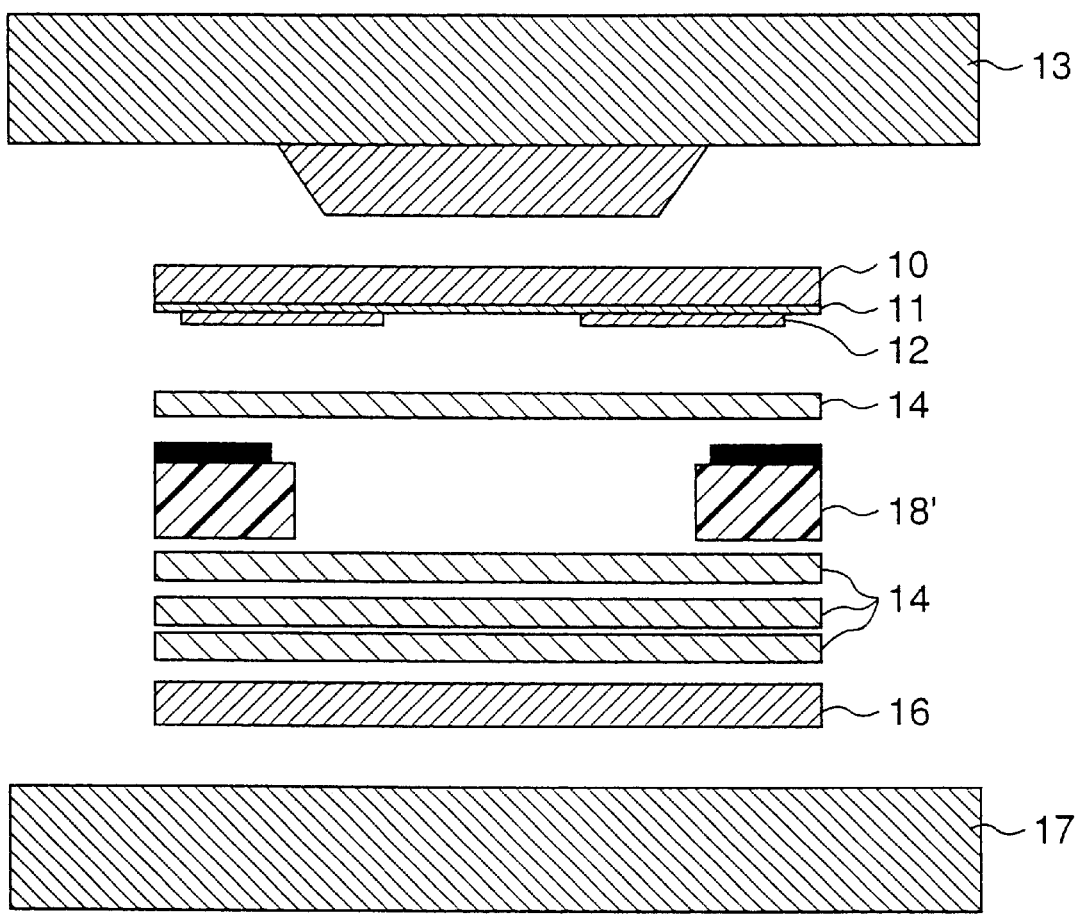
FIG. 16 is a cross sectional view showing other example of the fabricating method (press configuration) of the semiconductor device according to the present invention.

A patterned copper foil 10 with the similar construction as that of the example shown in FIG. 14 is heat pressed in the arrangement shown in FIG. 16 for two hours at a temperature of 180° C. and a pressure of 25 kg/cm$^2$. A projected portion of the die 13 has been fabricated to have a height of 0.5 mm with a slant angle of 45°. Sheets of teflon (Dupont Co.) with a thickness of 50 $\mu$m, which is not shown in the figure, are placed in between the dies 13, 17 and copper foils 10, 16 to provide cushion layers during the press shaping process. Prepregs fabricated by Hitachi Chemical Co., Ltd. by impregnating heat resist epoxy into glass fabric are used.

A glass epoxy substrate 18' with 0.5 mm thickness is hollowed out at position corresponding to the projected portion of the die 13. In the instant example, a piece of the prepreg 14 of 0.1 mm thickness without a hole is placed in between the glass epoxy substrate 18' and the patterned copper foils 10, and three pieces of the prepregs 14 are placed the lower side of the glass epoxy substrate 18'.

The glass epoxy substrate fabricated by the conditions described above contains a plurality of device units, each comprising the same wiring and the same cavity portion. The carrier copper foil of the glass epoxy substrate is etched by the alkali etchant described above to remove the carrier copper foil from the whole surface area, and then the nickel layer is etched away by an etching solution for selectively etching nickel.

According to the above mentioned conditions, cavity portions of 0.5 mm depth are formed in the substrate with 1 mm thickness, and the continuous wiring is disposed at the surface layer including surface planes of the cavity portions. The semiconductor chips 1 are adhered in the cavity portions, and connected by the wire bonding. The semiconductor chip 1 and the wire bonding portion are sealed with liquefied plastic sealant. After solder balls 5 are attached, the substrate is diced and separated into each units to complete the semiconductor device.

According to the present embodiment, the semiconductor device may be provided with a simple structure, and fabricated utilizing simpler fabricating process of lower cost.

Next, other embodiments of the semiconductor device, the substrate and the fabricating method of the present invention are now explained with reference to FIGS. 17–20.

Figure 17:
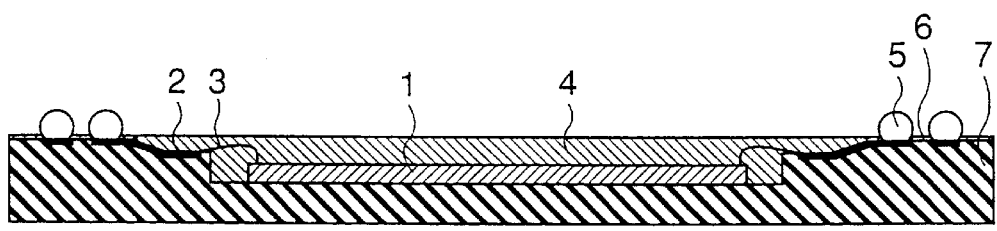
FIG. 17 is a cross sectional view showing other example of the semiconductor device according to the present invention.

As shown in FIG. 17, the semiconductor device of the present embodiment is provided with a semiconductor chip 1, an insulator substrate 7 having a semiconductor chip mount portion for mounting the semiconductor chip 1, external electrodes 5 formed at an surface of the insulation substrate 7 and electrically connected to the semiconductor chip 1 for making connections to outside when the semiconductor chip 1 was mounted, plastic sealant 4 for sealing the semiconductor mounting portion in which the semiconductor chip 1 had been mounted. Furthermore, the semiconductor device of the present embodiment is provided with ramps between wires 3 for connecting to the semiconductor chip 1 and the external electrode 5, and wiring 2 disposed along slope portion of the ramp connecting in between. A numeral 6 in the figure indicates a surface insulation layer formed at a surface of the insulation substrate 7.

The semiconductor chip mount portion of the semiconductor device of the present embodiment is fabricated by further hollowing out a base surface of a cavity portion of the semiconductor device package substrate, which is fabricated by a fabricating method which will be explained in the following section with reference to FIG. 20, for example.

A slant angle of side surfaces of the cavity portion is less than 45°. The slant angle may be determined in accordance with a slant angle of the projected portion of the die for the press forming, or a balance between a rigidity of a transfer copper foil (carrier layer) 10 and a pressure during the press forming.

Figure 18:
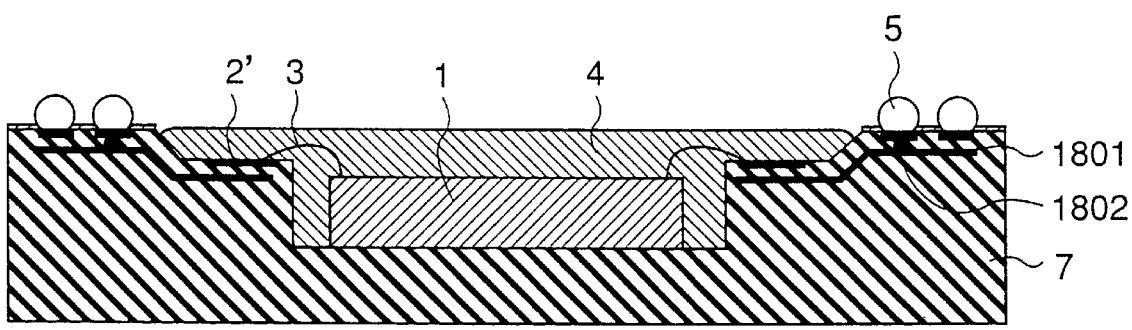
FIG. 18 is a cross sectional view showing other example of the semiconductor device according to the present invention.

The semiconductor device of the present embodiment is not limited to an example shown in FIG. 17. The semiconductor device may be provided with a multiple layer structure as shown in FIG. 18, wherein the wiring 2 is disposed in the bottom surface of the cavity portion instead of its side walls, and a ground layer 1801 is provided below the wiring 2 while having an insulation layer in between. Furthermore, the semiconductor device may be provided with interlayer connection portions 1802 for connecting the ground layer 1801 and the external electrodes 5.

In the present embodiment, a method for forming the ground layer 1801 and a method for interconnecting the layers are not limited to any particular arts. For example, the multiple layer structure of the substrate may be formed by placing a copper foil or a copper pattern which forms the ground layer 1801 at a position facing to the wiring substrate, placing insulation adhesive sheets such as prepregs in between them, piling up the prepregs further, and press forming them altogether.

An example of the fabricating method of the semiconductor chip package substrate in the present embodiment will now be explained with reference to FIGS. 19, 20.

Basic structure of the fabricating method of the present embodiment is the same as that of two previous embodiments of the fabricating methods. In the following explanation, only parts of the fabricating method different from the previous embodiments will be explained, and detail explanations regarding the similar parts will be omitted.

A three layer structure foil comprising a 25 $\mu$m thick copper foil 10 (carrier layer), a copper layer 12 which will comprises the wiring layer, and a barrier layer 11 placed between the carrier layer 10 and the copper layer 12, is used as a transfer metal foil for forming the wiring 2 in the instant example of the fabricating method of the present embodiment, as the same way as in two previous embodiments. The two layers 11, 12 are shown together in the figure.

Figure 19:
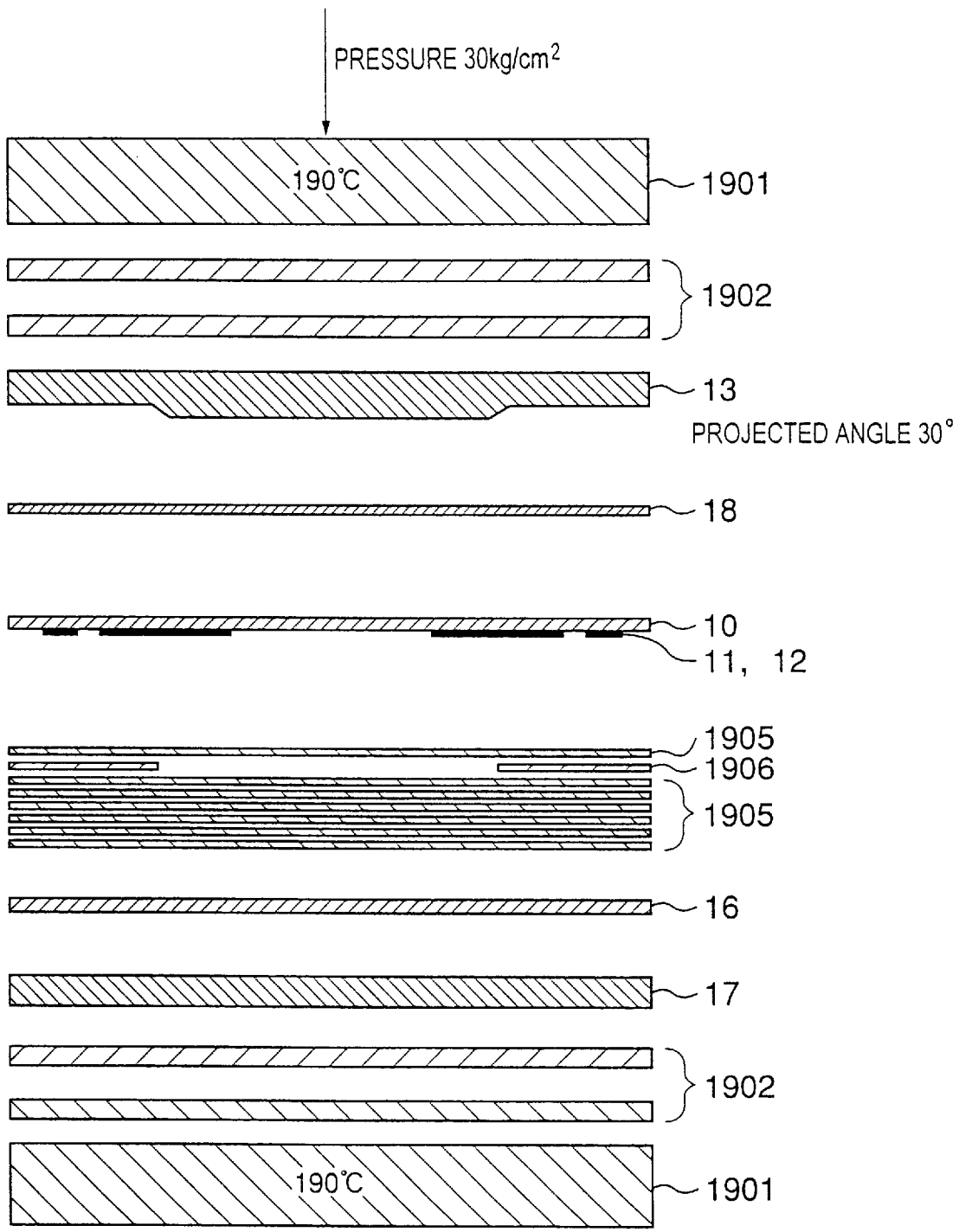
FIG. 19 is a cross sectional view showing other example of the fabricating method (press configuration) of the semiconductor device according to the present invention.

As shown in FIG. 19, the copper foil with the pattern 10–12 is heat pressed between top boards 1902 and heat boards 1901 at a temperature of 190° C. with a pressure of 30 kg/cm². A piece of aluminum foil 18, the patterned copper foil of the three layer structure 10–12, a plurality of prepregs 1905, 1906, and a copper foil 16 with a thickness of 35 $\mu$m are arrayed from top to bottom of the figure between the upper die 13 and the lower die 17.

A projected portion of the upper die 13 has a trapezoidal cross sectional shape and slant side surfaces with a slant angle of 30°. The prepreg 1906 has a through hole at a position corresponding to the projected portion of the die 13, and is placed below the first prepreg 1905.

Figure 20:
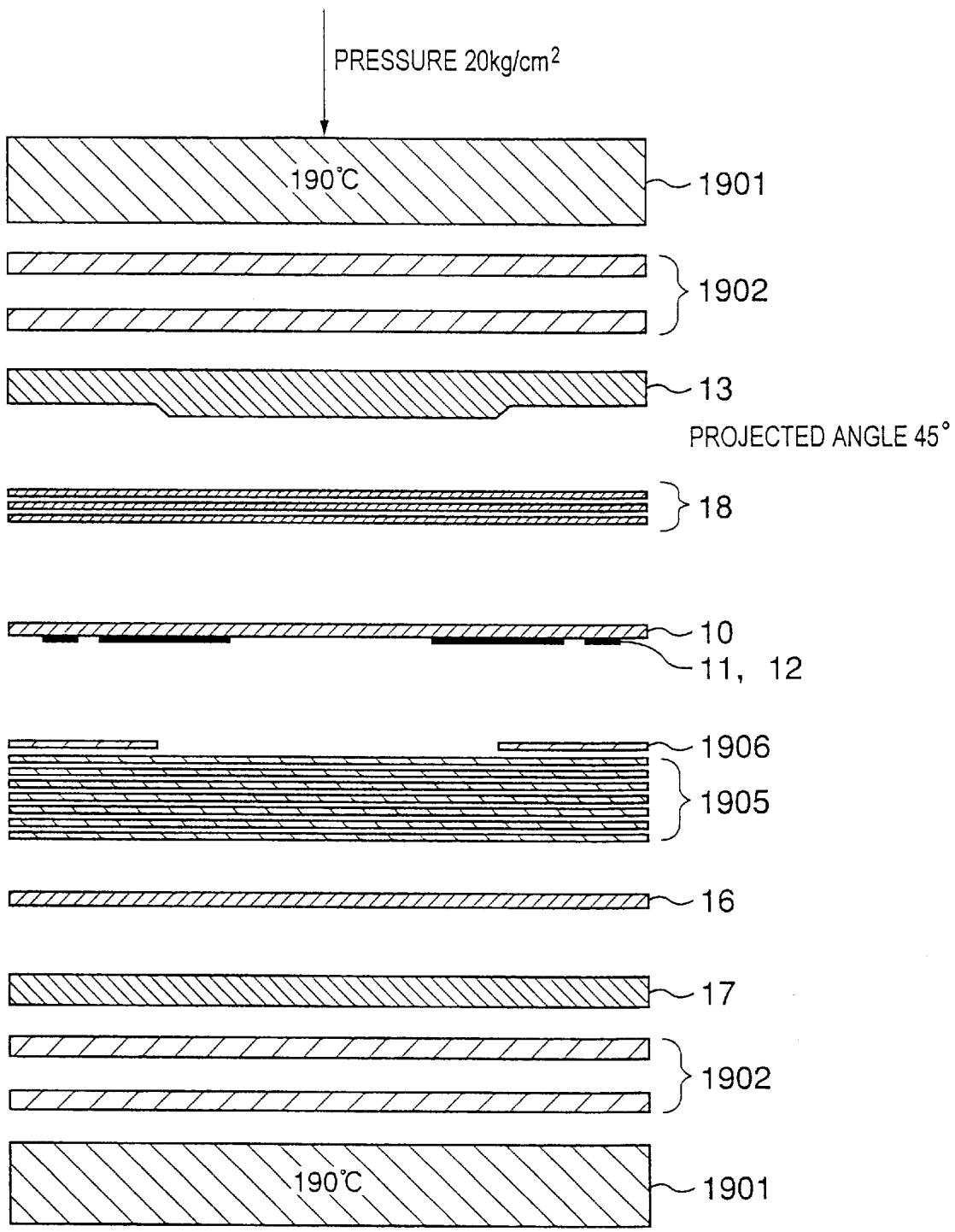
FIG. 20 is a cross sectional view showing other example of the fabricating method (press configuration) of the semiconductor device according to the present invention.

The fabricating method of the present embodiment is not limited to only the example shown in FIG. 19, but also an arrangement shown in FIG. 20 may be used.

Namely, the copper foil with the pattern 10–12 is heat pressed between top boards 1902 and heat boards 1901 at a temperature of 190° C. with a pressure of 20 kg/cm². Three pieces of aluminum foils 18, the patterned copper foil of the three layer structure 10–12 including the a 35 $\mu$m copper foil 10, a piece of prepreg 1906 with a through hole, a plurality of prepregs 1905, 1906, and a copper foil 16 with a thickness of 35 $\mu$m are arrayed between the upper die 13 and the lower die 17 from top to bottom of the figure, the die 13 having a projected portion with side surfaces of a slant angle of 45°.

According to the fabricating method shown in FIG. 20, the semiconductor device may be provided with the cavity portion with side walls of a lesser slant angle as shown in FIG. 17.

Figure 21A:
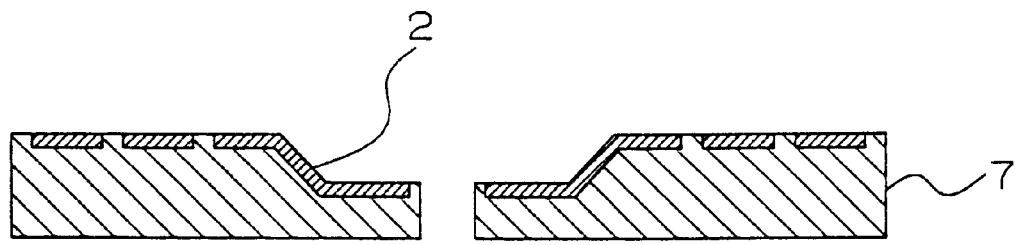
FIG. 21A is a cross sectional view showing other example of the semiconductor chip package substrate according to the present invention.
Figure 21B:
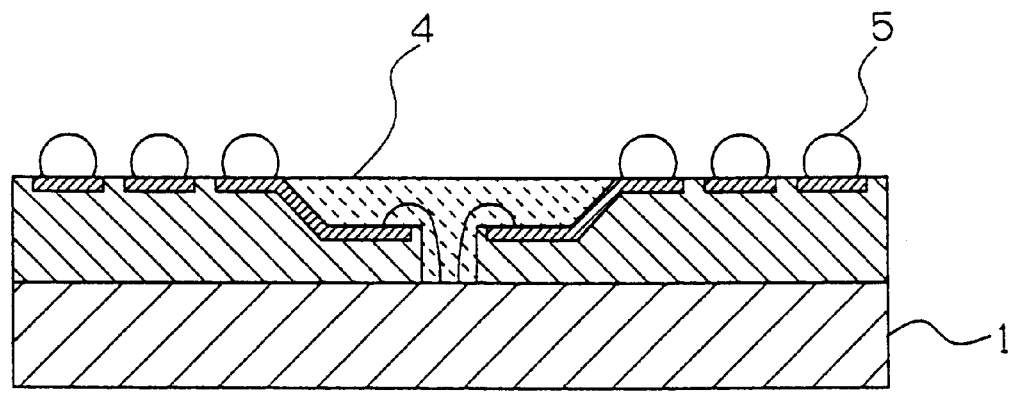
FIG. 21B is a cross sectional view showing other example of the semiconductor device according to the present invention.

The semiconductor chip package substrate of the present invention may be a semiconductor chip package substrate with a cavity portion as shown in FIG. 21A or FIG. 21B comprising wiring disposed along the top surface of the substrate and wall surfaces of the cavity portion, wherein the wiring comprises an external connection terminal portion for connecting external connection terminals formed on a surface of the substrate at an opening side of the cavity portion, an internal connection terminal portion for connecting to the mounted semiconductor chip, and a wiring portion disposed between the external connection terminal portion and the internal connection terminal portion. Furthermore, the wiring is disposed on the substrate surface and wall surfaces of the cavity portion, and the internal connection terminal portion is disposed inside of the cavity portion.

Figure 22A:
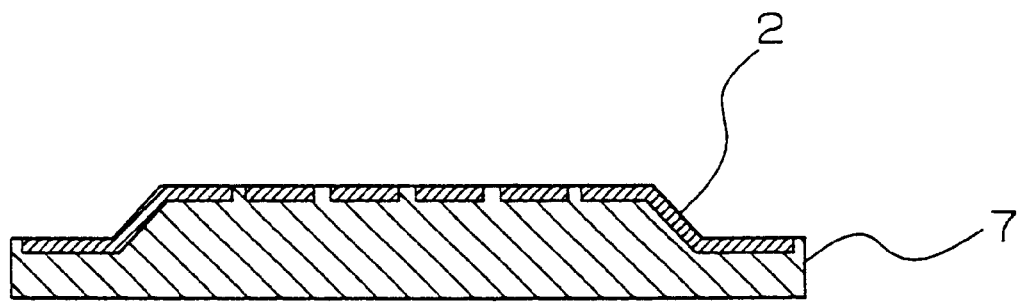
FIG. 22A is a cross sectional view showing other example of the semiconductor chip package substrate according to the present invention.
Figure 22B:
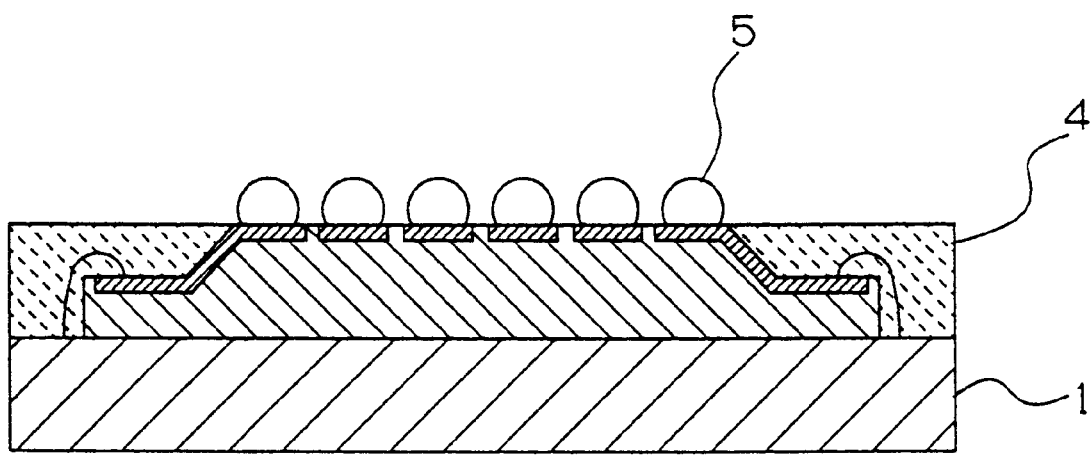
FIG. 22B is a cross sectional view showing other example of the semiconductor device according to the present invention.

In FIG. 21A, FIG. 22B, numeral 7 indicates the insulation substrate, numeral 2 indicates the wiring buried in the substrate surface and the wall surfaces of the cavity portion. A through hole at the center of the cavity portion is formed in the semiconductor chip package substrate of FIG. 21A. FIG. 21B shows a semiconductor device utilizing the semiconductor chip package substrate. In FIG. 21B, numeral 1 indicates the semiconductor chip which is adhesive-mounted on the substrate, numeral 4 indicates plastic sealant, numeral 5 indicates the external connection terminals. The cavity portion of the substrate, in which the internal connection terminal portion of the wiring is formed, is sealed by the plastic. The substrate may be fabricated by the fabricating method described above.

The semiconductor chip package substrate of FIG. 22A has cavity portions formed at both edges, which can be fabricated by forming a plurality of device units, each of which corresponds to the semiconductor device, on the substrate described above, and by dicing at the cavity portions to separate the each unit. The semiconductor device utilizing such a substrate is shown in FIG. 22B. In FIG. 22B, numeral 1 indicates the semiconductor chip which is adhesive-mounted on the substrate, numeral 4 indicates plastic sealant, numeral 5 indicates the external connection terminal. The cavity portions at the both edges, in which the internal connection terminal portions of the wiring are formed, are sealed with the plastic.

According to the present invention, the semiconductor chip package substrate with a plurality of the units may be fabricated by single press forming process.

Figure 23:
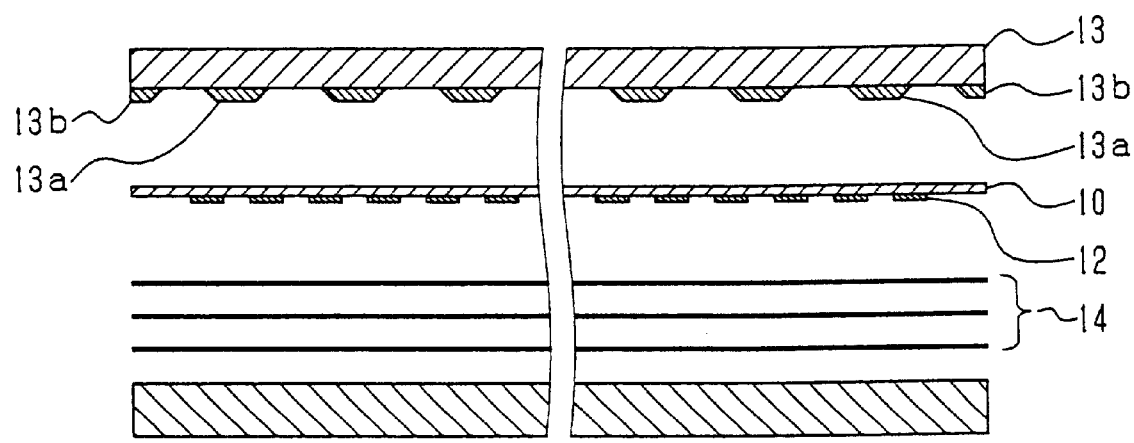
FIG. 23 is a cross sectional view showing other example of the fabricating method (press configuration) of the semiconductor device according to the present invention.
Figure 24A:
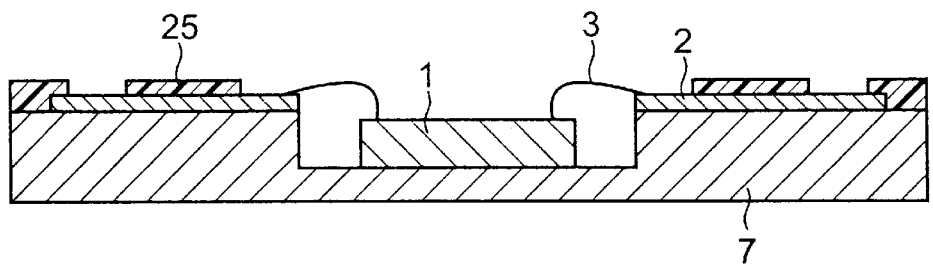
FIG. 24A is a cross-sectional view of a substrate on which a semiconductor chip is mounted, and connected by wire bonding.
Figure 24B:
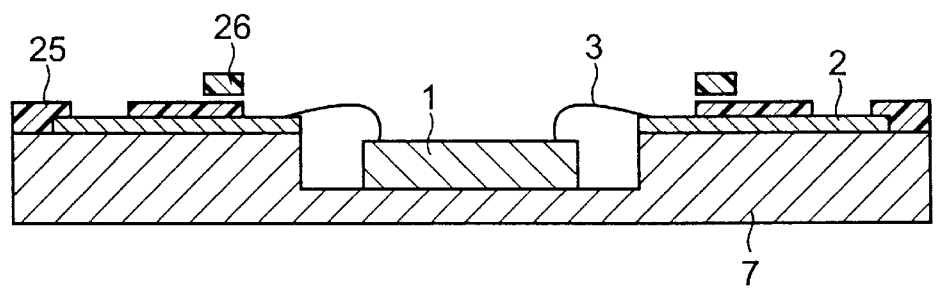
FIGS. 24B and 24C are a cross-sectional view and a perspective view, respectively, showing a state where an encapsulation dam is provided on the one shown in FIG. 24A.
Figure 24C:
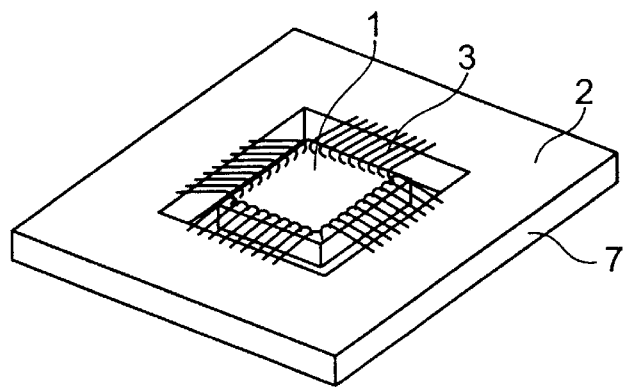
Figure 24D:
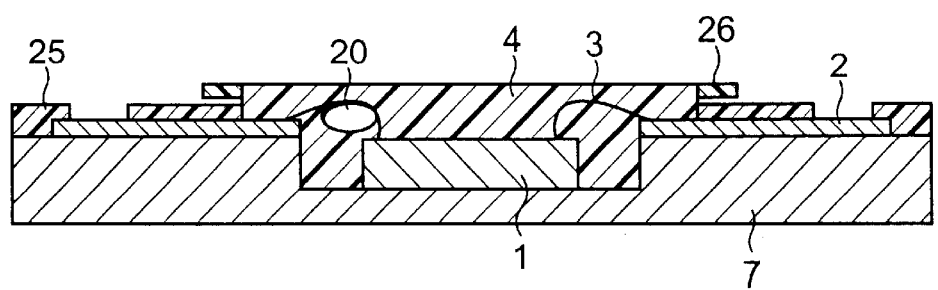
FIG. 24D is a cross-sectional view of a semiconductor device encapsulated by dispensing, using a liquid resin encapsulant.
Figure 25A:
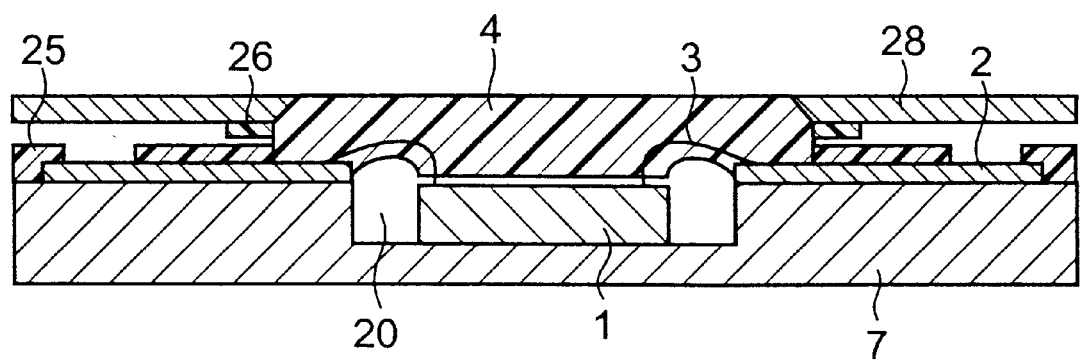
FIGS. 25A and 25B are cross-sectional views of a semiconductor device encapsulated by printing, using a liquid resin encapsulant.
Figure 25B:
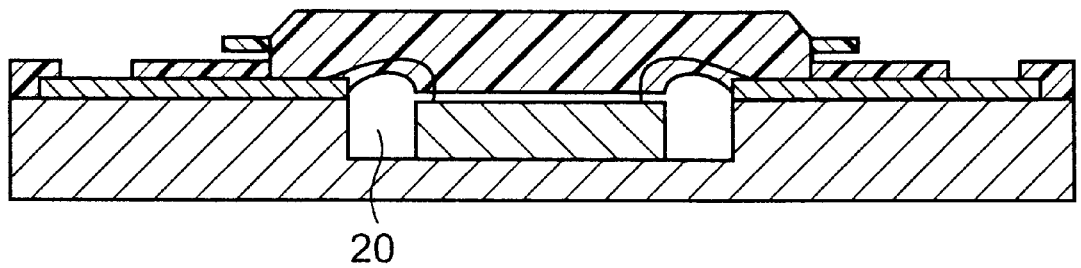

FIG. 23 shows a cross sectional view of a arrangement of the press forming for fabricating the semiconductor chip package substrate with a plurality of the device units. Numeral 13 indicates the die provided with a plurality of the projected portions 13a, numeral 17 indicates the lower die, numeral 10 indicates a copper foil in which a plural sets of the wiring are formed, and numeral 14 indicates prepregs.

A plurality of the cavity portions and the wiring 12, which is continuously buried into the substrate surfaces from the external connection terminal portion to the internal connection terminal portion in the cavity portion via the wall surfaces of the cavity portion, are formed by single press forming process utilizing a plurality of the projected portions 13a, which are arrayed and evenly separated from each other in longitudinal and lateral directions. According to the instant example, the external connection terminal portion on the substrate surface may precisely keep its position on the surface plane, at where the external connection terminal portion receives equal tensile forces generated during the formation of neighboring cavity portions, during the press forming process (high dimension stability). Namely, the formation of the multiple device units on the semiconductor chip package substrate of the present invention enables to form the cavity portion without causing any shifts from the designed position of the external connection terminal portion on the surface plane, which is set prior to the press forming process. An alignment process for forming the solder resist at areas other than locations, where external connection terminals of the external connection terminal portion are to be formed, becomes easier when the position of the external connection terminal portion on the substrate surface is kept the same as before the press forming process. In the outermost area, dummy projected portions 13b may be disposed along circumference of the die 13. According to the dummy projected portion 13b, the positional shift of the external connection terminal portions disposed at the outermost area of the substrate, and flows of plastic of the prepregs may be prevented. A number of the multiple device units on the substrate is preferred to be not less than 7×7.

According to the present invention, the semiconductor device may be fabricated by the steps comprising; a step for preparing the press forming assembly including the upper die with a plurality of the projected portions arrayed evenly in longitudinal and lateral directions, the wiring construction body comprising wiring positioned in correspondence to the projected portions and the carrier metal foil, prepregs, and the lower die; a step for pressing the assembly in between the upper and the lower dies to form a plurality of cavity portions on the substrate consisting of the pressed prepregs, and to bury the wiring into a surface of the substrate and wall surfaces of the substrate in the cavity portion in single process; a step for removing the carrier metal foil; a step for mounting the semiconductor chip; a step for sealing the cavity portions with plastic; a step for forming the external connection terminals; and a step for dicing and separating into each device unit.

Example 7

Figure 27A:
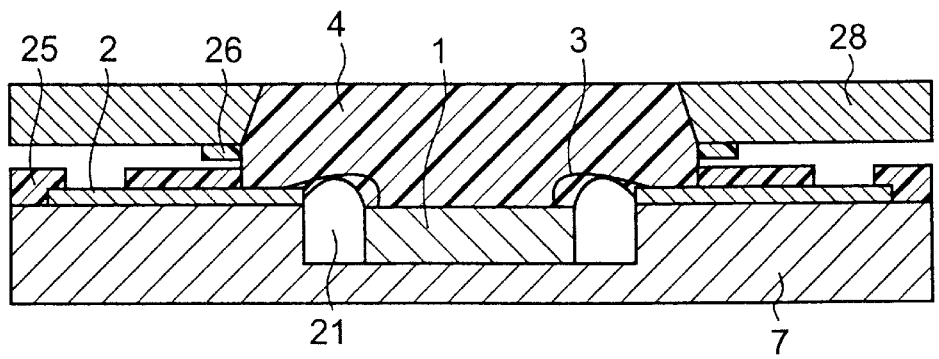
FIGS. 27A to 27E are cross-sectional views showing steps in a semiconductor device fabrication process in an Example of the present invention.

An encapsulation target in the present Example has, as shown in FIG. 27A, a semiconductor chip 1 bonded to the hollow place bottom surface of a substrate 7, a surface wiring 2 formed on the substrate surface, a solder resist 25 and an encapsulation dam 26. Dimensions closely concerned with pressure differential short circuit are 280 $\mu$m as thickness of the semiconductor chip 1 and about 100 $\mu$m as stretch height of bonding wires 3. The apex of the bonding wires is kept substantially equal in height to the top surface of the solder resist on the substrate 7, and the encapsulation dam 26, made of a resin, is provided on the top surface of the solder resist 25.

The above encapsulation target, a printing metal mask 28 of 0.3 mm thick and a solvent type liquid resin encapsulant HIR-3000 (solvent content: 20% by weight), available from Hitachi Chemical Co., Ltd., were set in a vacuum container of a vacuum pressure differential printing apparatus (Model: VD-1000) manufactured by Toray Engineering Co., Ltd. After evacuation to 5 Torr, first-time printing was carried out. In this state, an empty space 21 was presumed to be present as shown in FIG. 27A.

Figure 27B:
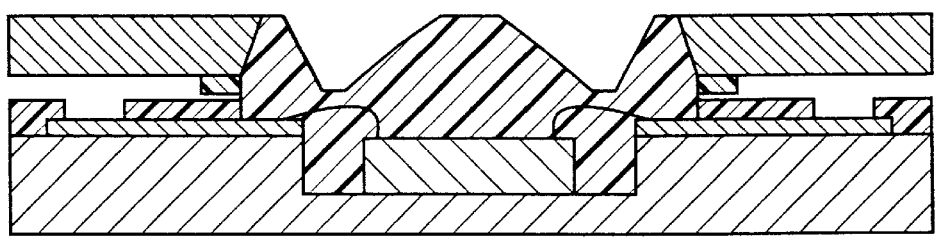
Figure 27C:
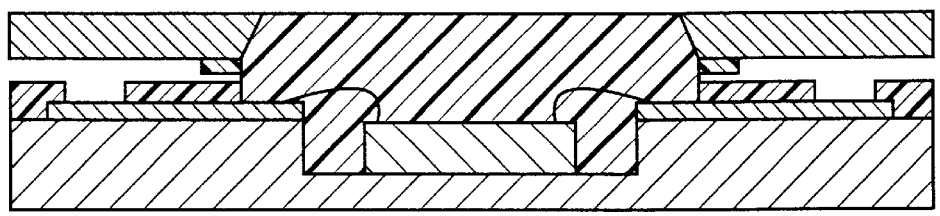
Figure 27D:
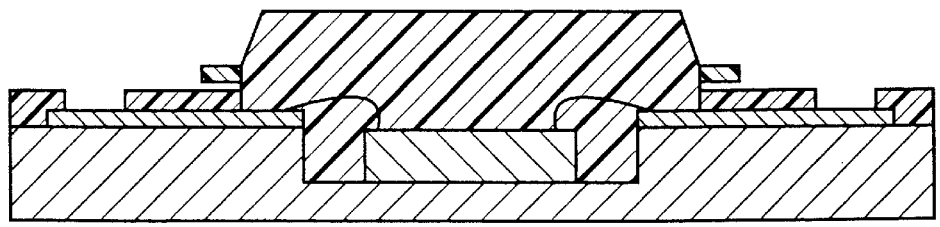
Figure 27E:
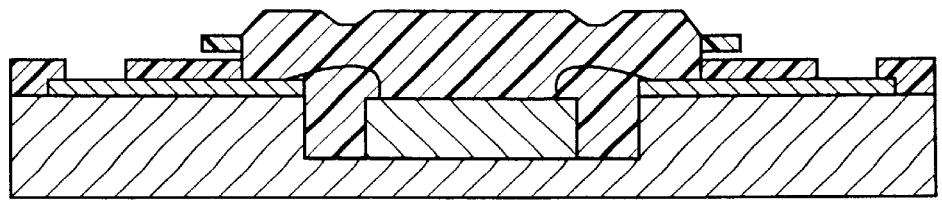

Next, the inside of the vacuum container was evacuated to 150 Torr, whereupon the resin was sucked into the empty space as shown in FIG. 27B and a depression appeared at the resin surface. Second-time printing was carried out while keeping the vacuum of 150 Torr, to fill up the depression (FIG. 27C). Thereafter, the vacuum was returned to atmospheric pressure, the printing metal mask 28 was removed, and the printed article was taken out of the vacuum pressure differential printing apparatus (FIG. 27D), followed by heating in a drying oven at 120° C. and 180° C. for 1 hour each to effect curing. Observation of a cross section of the product after drying revealed that as shown in FIG. 27E any empty space, air bubbles and the like were not seen in the interior of the cured encapsulation resin and also that the height of rise of the encapsulation resin was put as low as 0.2 mm or less. Thus, a good state of encapsulation was attained.

In the present Example, as shown in FIG. 33A, the relationship of A≧0.8 B was ensured between the thickness A of the encapsulant lying above the wires and the thickness B of the encapsulant lying beneath the wires, where vacuum pressure differential printing free of any pressure differential short circuit was achievable. It has been confirmed that the semiconductor device obtained according to the present Example is free of any encapsulation defects and hence has superior resistance to moisture and resistance to temperature cycles.

Example 8

Figure 28A:
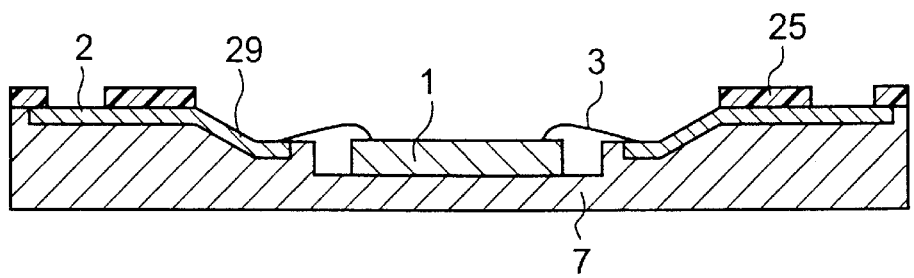
FIGS. 28A to 28F are cross-sectional views showing steps in a semiconductor device fabrication process in an Example of the present invention.

An encapsulation target was prepared in which as shown in FIG. 28A the side wall of a first hollow place provided in a substrate 7 forms a slant 29. Depth of the hollow place, i.e., the height of the slant is 300 μm. A second hollow place is provided in a bottom area of the first hollow place, and a semiconductor chip 1 is bonded to the bottom surface of the second hollow place. The semiconductor chip 1 is 280 μm in thickness and bonding wires 3 are about 100 μm in stretch height. The top surface of the semiconductor chip 1 is kept substantially equal in height to the bottom surface of the first hollow place of the substrate 7.

Figure 28B:
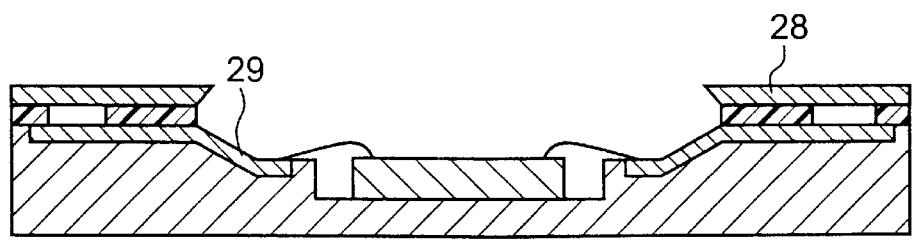
Figure 28C:
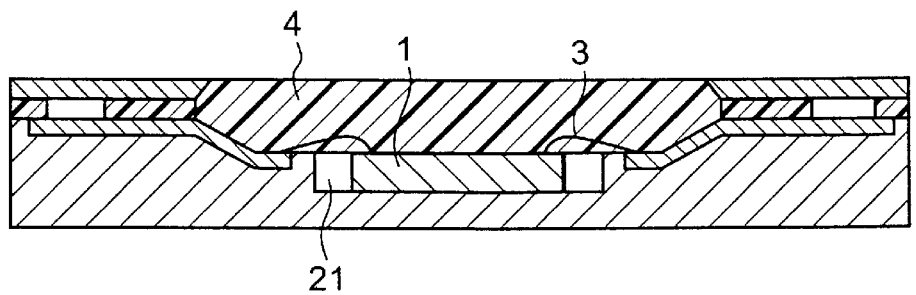

The above encapsulation target, a printing metal mask 28 of 0.15 mm thick and a solvent-free type epoxy liquid resin encapsulant CEL-C-7200, available from Hitachi Chemical Co., Ltd., were set in a vacuum container of a vacuum pressure differential printing apparatus (Model: VD-1000) manufactured by Toray Engineering Co., Ltd.(FIG. 28B). After evacuation to 5 Torr, first-time printing was carried out. In this state, an empty space 21 was presumed to be present (FIG. 28C).

Figure 28D:
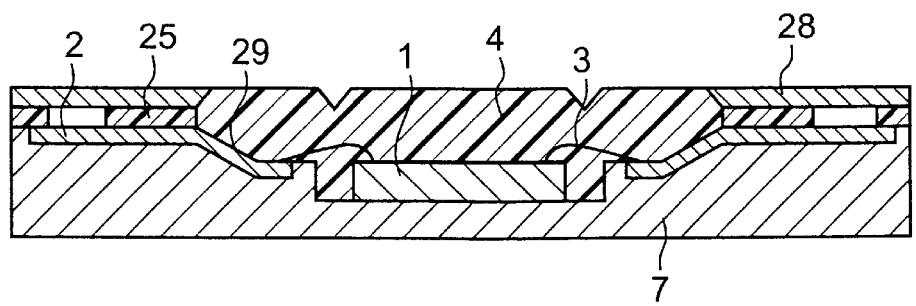
Figure 28E:
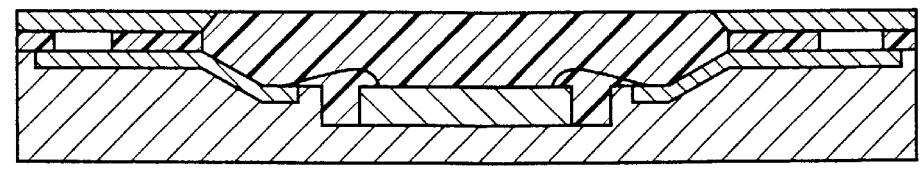
Figure 28F:
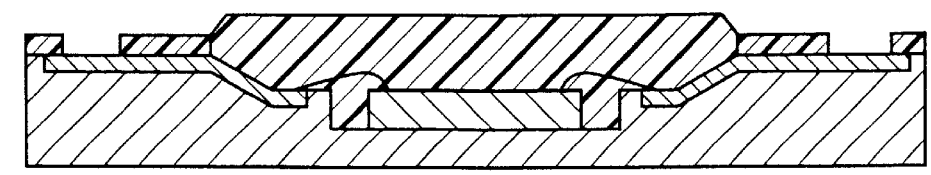

Next, the inside of the vacuum container was evacuated to 150 Torr, whereupon the resin was sucked into the empty space as shown in FIG. 28D and a depression appeared at the resin surface. Second-time printing was carried out while keeping the vacuum of 150 Torr, to fill up the depression (FIG. 28E). Thereafter, the vacuum was returned to atmospheric pressure, the printing metal mask 28 was removed, and the printed article was taken out of the vacuum pressure differential printing apparatus, followed by heating at 70° C. and 150° C. for 1 hour each to effect curing. Observation of a cross section of the product after curing revealed that as shown in FIG. 28F any empty space, air bubbles and the like were not seen in the interior of the cured encapsulation resin and also that the height of rise of the encapsulation resin was put as low as 0.1 mm or less. Thus, a good state of encapsulation was attained.

In the present Example, as shown in FIG. 33B, the relationship of A≧0.8 B was ensured, where vacuum pressure differential printing free of any pressure differential short circuit was achievable. It has been confirmed that the semiconductor device obtained according to the present Example is free of any encapsulation defects and hence has superior resistance to moisture and resistance to temperature cycles.

Example 9

Figure 29A:
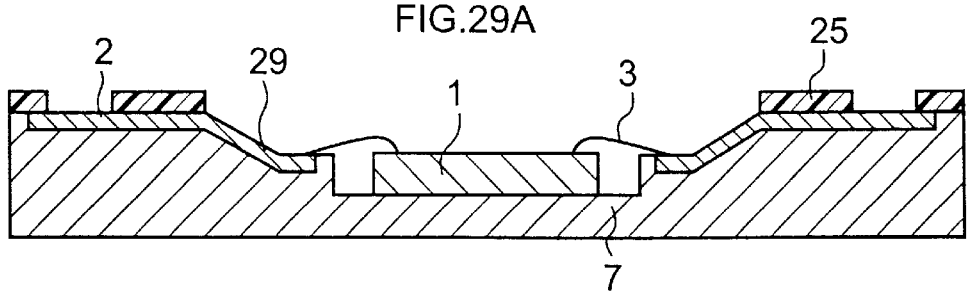
FIGS. 29A to 29E are cross-sectional views showing steps in a semiconductor device fabrication process in an Example of the present invention.
Figure 29B:
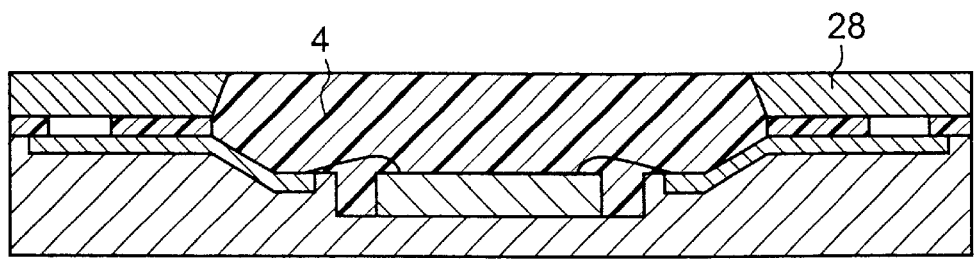
Figure 29C:
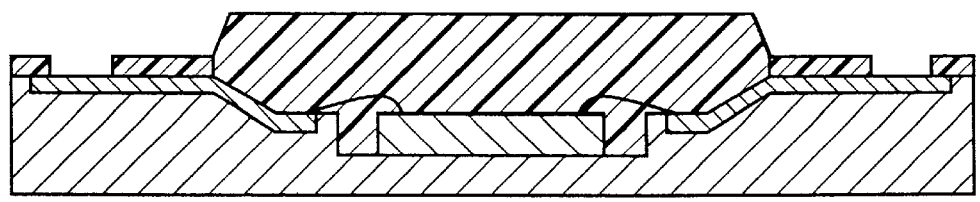

In the present Example, an encapsulation target (FIG. 29A), a printing metal mask 28 of 250 μm thick (FIG. 29B) and a solvent type liquid resin encapsulant HIR-3000 (solvent content: 30% by weight), available from Hitachi Chemical Co., Ltd., were set in a vacuum container of a vacuum pressure differential printing apparatus (Model: VD-1000) manufactured by Toray Engineering Co., Ltd. After evacuation to 5 Torr, first-time printing was carried out, and then second-time printing was carried out at a vacuum of 150 Torr. Thereafter, the vacuum was returned to atmospheric pressure, the printing metal mask 28 was removed, and the printed article was taken out of the vacuum pressure differential printing apparatus (FIG. 29C), followed by heating in a drying oven at 120° C. and 180° C. for 1 hour each.

Figure 29D:
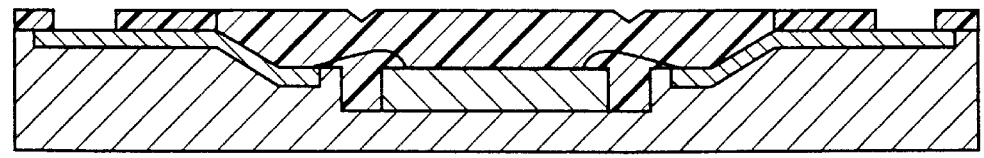
Figure 29E:
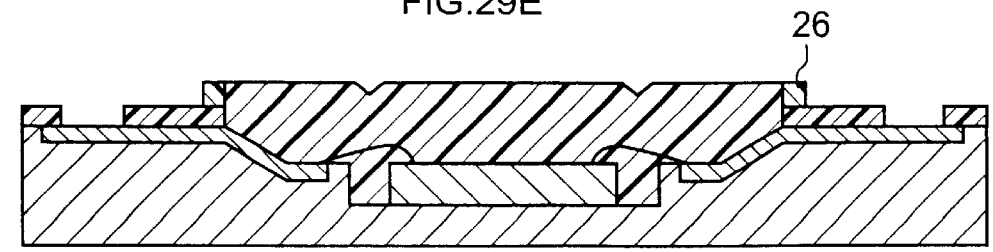

Observation of a cross section of the product after drying revealed that as shown in FIG. 29D any empty space, air bubbles and the like were not seen in the interior of the cured encapsulation resin and also that the rise of the encapsulation resin was little seen. Thus, a good state of encapsulation was attained in a height substantially the same as the substrate surface. Also, in the encapsulation target used in the present Example, an encapsulation dam 26 was provided on the surface of a solder resist 25, and this was tested in the same way. As a result, as shown in FIG. 29E an encapsulated member with a height substantially equal to the top surface of the dam 26 was obtained in a good state of encapsulation.

In the present Example, as shown in FIG. 33C, the relationship of A≧0.8 B was ensured, where vacuum pressure differential printing free of any pressure differential short circuit was achievable. It has been confirmed that the semiconductor device obtained according to the present Example is free of any encapsulation defects and hence has superior resistance to moisture and resistance to temperature cycles.

Example 10

Figure 30A:
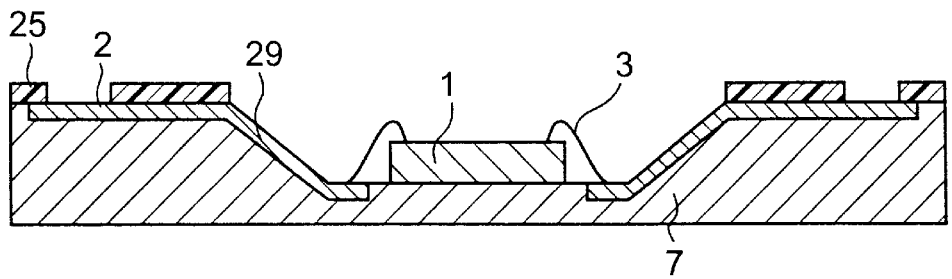
FIGS. 30A and 30B are cross-sectional views showing steps in a semiconductor device fabrication process in an Example of the present invention.

In the present Example, an encapsulation target was prepared in which as shown in FIG. 30A, using a wiring substrate 7 having a hollow place, a semiconductor chip 1 of 0.28 mm thick was bonded to the bottom surface of the hollow place with a die bonding paste (EN-4390, available from Hitachi Chemical Co., Ltd.) and thereafter an aluminum electrode on the semiconductor chip 1 and an internal connecting terminal provided at the bottom of the hollow place of the substrate were connected by wire bonding using gold wires of 25 μm diameter. Here, the bonding wires 3 are about 120 μm in stretch height from the top surface of the semiconductor chip, and a slant 29 extending to the bottom surface of the substrate hollow place is 0.5 mm in depth.

Figure 30B:
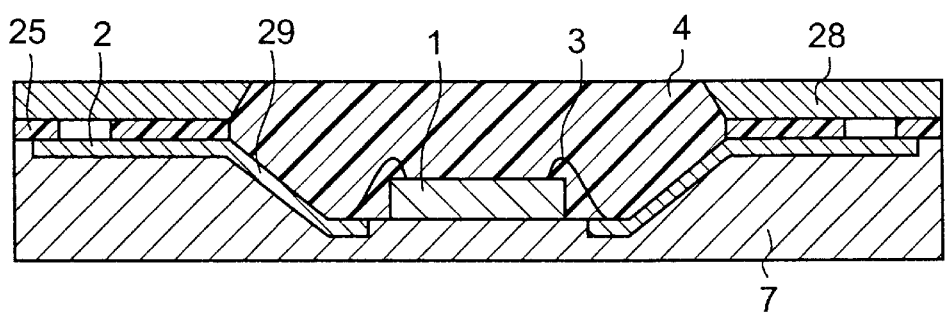

This encapsulation target, a printing metal mask 28 of 250 μm thick (FIG. 30B) and a solvent type liquid resin encapsulant HIR-3000 (solvent content: 30% by weight), available from Hitachi Chemical Co., Ltd., were set in a vacuum container of a vacuum pressure differential printing apparatus (Model: VD-1000) manufactured by Toray Engineering Co., Ltd. After evacuation to 10 Torr, first-time printing was carried out, and then second-time printing was carried out at a vacuum of 150 Torr. Thereafter, the vacuum was returned to atmospheric pressure, the printing metal mask 28 was removed, and the printed article was taken out of the vacuum pressure differential printing apparatus, followed by heating in a dying oven at 120° C. and 180° C. for 1 hour each.

Observation of a cross section of the product after drying revealed that any empty space, air bubbles and the like were not seen in the interior of the cured encapsulation resin and also that the rise of the encapsulation resin was little seen. Thus, a good state of encapsulation was attained in a height substantially the same as the substrate surface.

In the present Example, as shown in FIG. 33C, the relationship of A≧0.8 B was ensured, where vacuum pressure differential printing free of any pressure differential short circuit was achievable. It has been confirmed that the semiconductor device obtained according to the present Example is free of any encapsulation defects and hence has superior resistance to moisture and resistance to temperature cycles.

Example 11

Figure 31A:
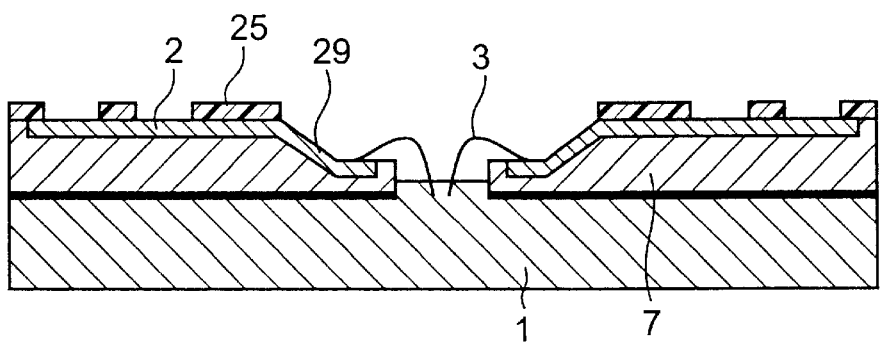
FIGS. 31A and 31B are cross-sectional views showing steps in a semiconductor device fabrication process in an Example of the present invention.

An encapsulation target was prepared in which as shown in FIG. 31A, onto a semiconductor chip 1 having a center pad, a substrate 7 having a slit opening of 0.6 mm wide at the part corresponding to the center pad was bonded with a die bonding film DF-400, available from Hitachi Chemical Co., Ltd., and thereafter an aluminum electrode of the chip and an internal connecting terminal of the substrate were connected through bonding wires 3. Here, the internal connecting terminal portion of the substrate is set hollow by 0.1 mm from the flat portion of the substrate and the substrate is 0.15 mm in thickness at its hollow place. Also, the bonding wires 3 are about 180 µm in stretch height.

Figure 31B:
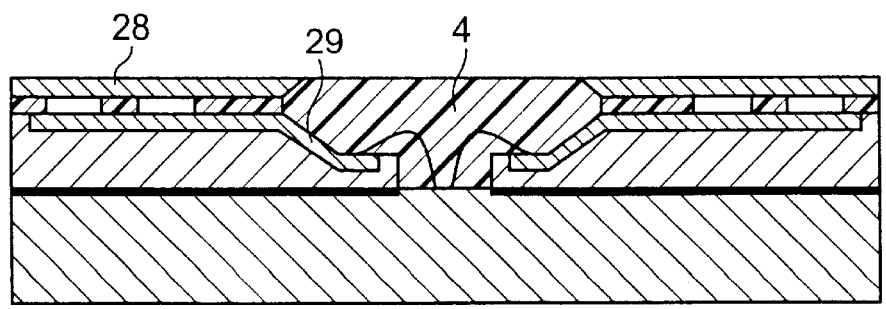

The above encapsulation target, a printing metal mask 28 of 0.1 mm thick (FIG. 31B) and a solvent-free type epoxy liquid resin encapsulant CEL-C-1900, available from Hitachi Chemical Co., Ltd., were set in a vacuum container of a vacuum pressure differential printing apparatus (Model: VD-1000) manufactured by Toray Engineering Co., Ltd. After evacuation to 5 Torr, first-time printing was carried out, and then second-time printing was carried out at a vacuum of 150 Torr. Thereafter, the vacuum was returned to atmospheric pressure, the printing metal mask 28 was removed, and the printed article was taken out of the vacuum pressure differential printing apparatus, followed by heating in a dying oven at 80° C. and 160° C. for 1 hour each to effect curing.

Observation of a cross section of the product after curing revealed that any empty space, air bubbles and the like were not seen in the interior of the cured encapsulation resin and also that the rise of the encapsulation resin was little seen. Thus, a good state of encapsulation was attained in a height substaintially the same as the substrate surface. It has been confirmed that the semiconductor device obtained according to the present Example is free of any encapsulation defects and hence has superior resistance to moisture and resistance to temperature cycles.

Example 12

Figure 32A:
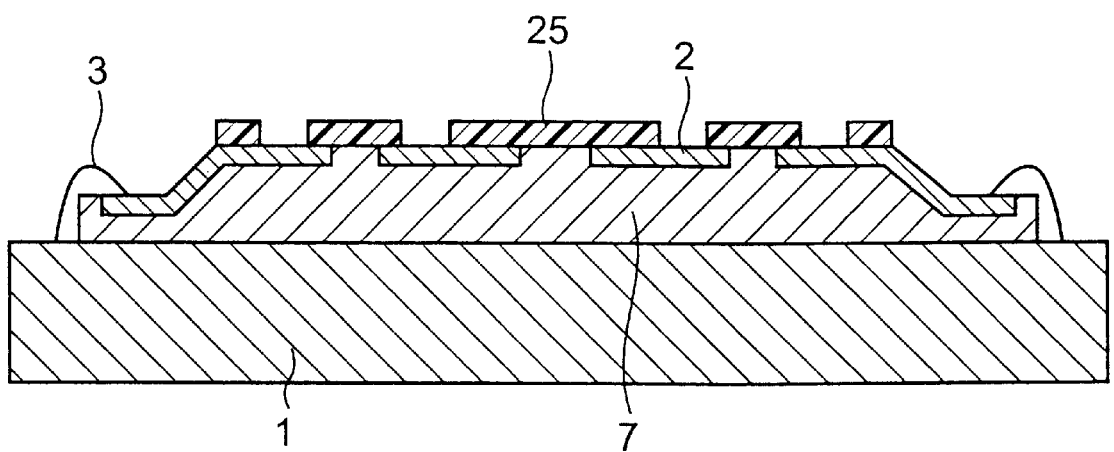
FIGS. 32A and 32B are cross-sectional views showing steps in a semiconductor device fabrication process in an Example of the present invention.
Figure 32B:
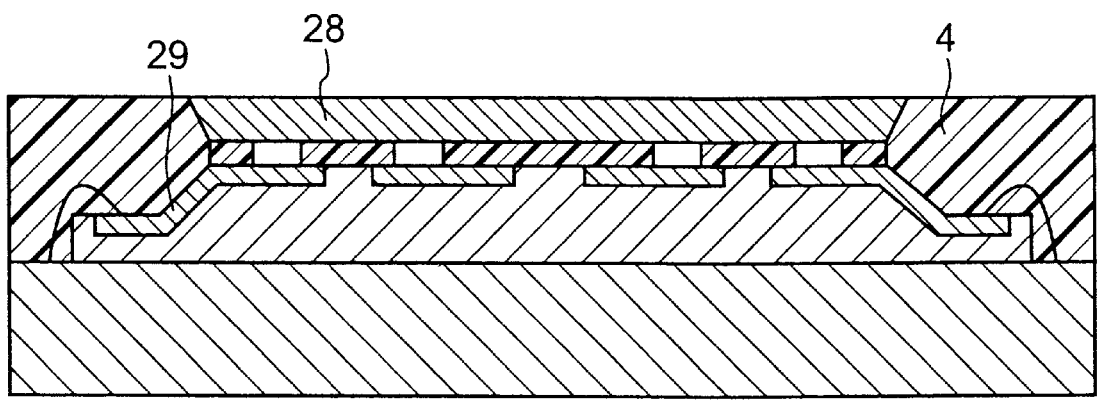

A chip 1 having a peripheral pad, shown in FIG. 32A was mounted to a substrate having a hollow surface structure and encapsulated in the same manner as in Example 11. As a result, as shown in FIG. 32B a good state of encapsulation was attained. It has been confirmed that the semiconductor device obtained according to the present Example is free of any encapsulation defects and hence has superior resistance to moisture and resistance to temperature cycles.

Comparative Example

Figure 26A:
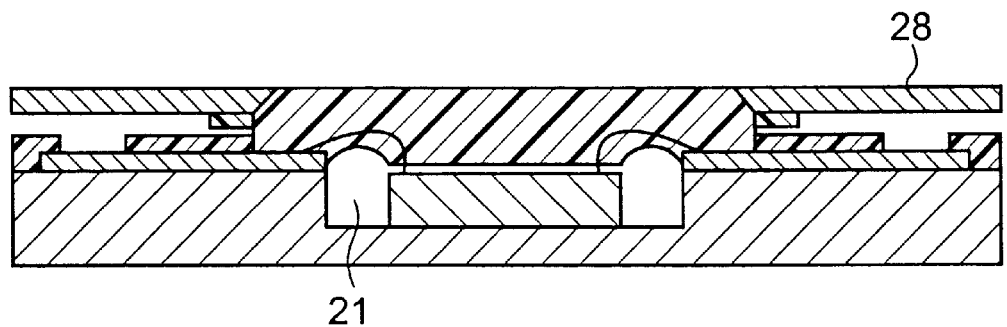
FIGS. 26A to 26C are cross-sectional views showing steps in a semiconductor device fabrication process which carries out encapsulation by conventional vacuum pressure differential printing, using a liquid resin encapsulant.
Figure 26B:
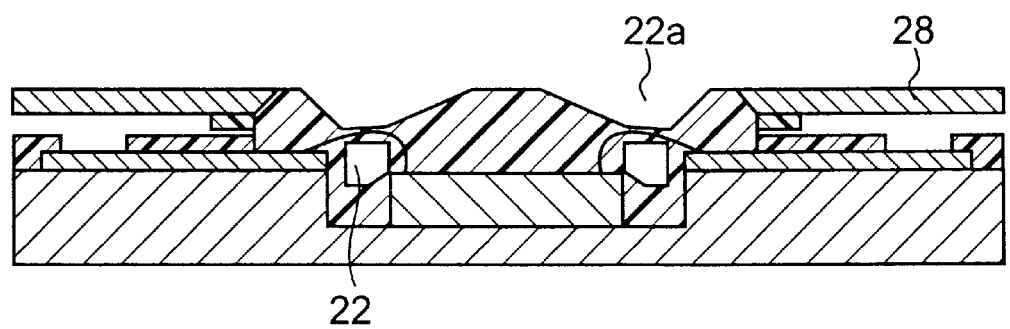
Figure 26C:
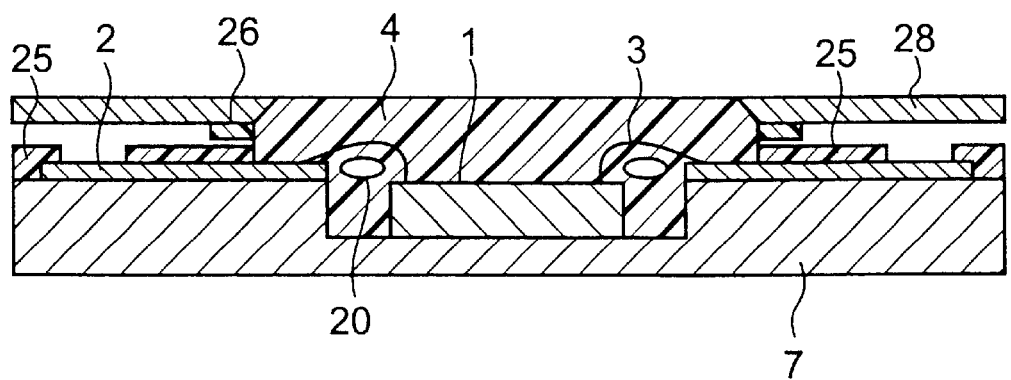

The procedure of Example 7 was repeated except that the solvent type liquid resin encapsulant HIR-3000 used therein was replaced with the solvent-free type liquid resin encapsulant CEL-C-1900. Observation of a cross section of the product after drying revealed that an empty space, air bubbles and the like were seen in the interior of the cured encapsulation resin as shown in FIG. 26C.

Example 13

As shown in FIG. 14, on a copper foil 10 of 35 µm thick (carrier foil available from Nihon Denkai K.K.), a nickel layer 21 of 0.5 µm thick was formed by plating and a copper layer of 5 µm thick was further formed to prepare a triple-layer structure foil.

On the surface of the 5 µm thick copper layer of this triple-layer structure foil, a resist pattern was formed by conventional photoresist processing, and the copper layer was removed by etching at its uncovered areas to form a wiring conductor 12. The etchant used here is required to have selectivity that it does not etch nickel and etches copper. Alkali etchants are preferred which are commonly used in the manufacture of printed boards. Here, the carrier foil 10 was protected with a resist so as not to be etched.

The copper foil 10 with the wiring conductor 12, six sheets of prepregs 14 and a copper foil 16 were superposed in layers as shown in FIG. 14, and were held between Teflon (available from Du Pont) sheets of 50 µm thick as cushioning sheets, followed by pressing using molds 13 and 17 under application of heat and pressure for 2 hours at a temperature of 180° C. and a pressure of 25 kg/cm². Here, each projection of the mold 13 was 0.15 mm in height and was 90 degrees in gradient. Also, as the prepregs (without cutout openings) 14, used were glass cloths impregnated with a heat-resistant epoxy resin, available from Hitachi Chemical Co., Ltd. Thus, a glass epoxy substrate was obtained in which a large number of like wirings and like hollow places were formed in a set.

The carrier copper foil 10 of this substrate was entirely removed by etching with the above alkali etchant, and the nickel layer was removed by etching with a nickel-selective etchant. Thus, a 1 mm thick substrate was obtained which had hollow places of 0.15 mm in depth and on which wiring was continuously formed on its surface layer embracing the hollow places.

This substrate was milled in a depth of 0.5 mm by means of a milling machine to make semiconductor chips mountable, and then cut into individual pieces. Semiconductor chips were bonded to the bottom surfaces of hollow places, followed by connection by wire bonding. The chips and wire-bonded portions were encapsulated with the liquid resin encapsulant according to the present invention to obtain semiconductor devices.

Example 14

The same copper foil 10 with a pattern as that in Example 13, prepregs 14 and 15 and a copper foil 16 were superposed in layers as shown in FIG. 15, and were held between Teflon (available from Du Pont) sheets of 50 µm thick as cushioning sheets, followed by pressing using molds 13 and 17 under application of heat and pressure for 2 hours at a temperature of 180° C. and a pressure of 25 kg/cm². Each projection of the mold 13 was 0.5 mm in height and was 45 degrees in gradient. Thus, a glass epoxy substrate was obtained in which a large number of like wirings and like hollow places were formed in a set.

As for the prepregs 14 and 15, used were glass cloths impregnated with a heat-resistant epoxy resin, available from Hitachi Chemical Co., Ltd. Some of the prepregs 15 were previously cut out at the part corresponding to each projection of the mold 13. Thus, the prepregs at the part corresponding to each projection of the mold were removed to the extent of the height of each projection of the mold 13. In the present Example, in which the projection was 0.5 mm in height, used were four sheets of prepregs 15 with cutout openings and four sheets of prepregs 14 without cutout openings, both prepregs 14 and 15 having a thickness of 0.1 mm.

The carrier copper foil 10 of the substrate obtained was entirely removed by etching with the alkali etchant mentioned in Example 13, and the nickel layer was removed by etching with a nickel-selective etchant. Thus, a 1 mm thick substrate was obtained which had hollow places of 0.5 mm in depth and on which wiring was continuously formed on its surface layer embracing the hollow places.

Semiconductor chips were bonded to the bottom surfaces of hollow places, followed by connection by wire bonding. The chips and wire-bonded portions were encapsulated with the liquid resin encapsulant according to the present invention and solder balls were mounted. Then the substrate was cut to obtain semiconductor devices in individual pieces.

Example 15

The same copper foil 10 with a pattern as that in Example 13, prepregs 14, a glass epoxy substrate 18' of 0.5 mm thick and a copper foil 16 were superposed in layers as shown in FIG. 16, and were held between Teflon (available from Du Pont) sheets of 50 μm thick as cushioning sheets, followed by pressing using molds 13 and 17 under application of heat and pressure for 2 hours at a temperature of 180° C. and a pressure of 25 kg/cm². Each projection of the mold 13 was 0.5 mm in height and was 45 degrees in gradient. Thus, a glass epoxy substrate was obtained in which a large number of like wirings and like hollow places were formed in a set.

As for the prepregs 14 and 15, used were glass cloths impregnated with a heat-resistant epoxy resin, available from Hitachi Chemical Co., Ltd. The glass epoxy substrate 18' was previously cut out at the part corresponding to each projection of the mold 13. In the present Example, one sheet of prepreg 14 of 0.1 mm thick and without any cutout opening was held between the glass epoxy substrate 18' and the copper foil 10 with a pattern, and three sheets of prepregs 14 were superposed in layers beneath the glass epoxy substrate 18'.

The carrier copper foil 10 of the substrate obtained was entirely removed by etching with the alkali etchant mentioned in Example 13, and the nickel layer was removed by etching with a nickel-selective etchant. Thus, a 1 mm thick substrate was obtained which had hollow places of 0.5 mm in depth and on which wiring was continuously formed on its surface layer embracing the hollow places.

Semiconductor chips were bonded to the bottom surfaces of hollow places, followed by connection by wire bonding. The chips and wire-bonded portions were encapsulated with the liquid resin encapsulant according to the present invention and solder balls were mounted. Then the substrate was cut to obtain semiconductor devices in individual pieces.

What is claimed is:

1. A semiconductor device fabrication process comprising an encapsulation step of carrying out encapsulation by vacuum pressure differential printing by the use of a liquid resin encapsulant containing a solvent in an amount of from 5% by weight to 50% by weight, wherein the encapsulation step comprises:

printing the liquid resin encapsulant by vacuum pressure differential printing in such a way that;

the encapsulant covers at least an internal connecting terminal provided on a substrate, a semiconductor chip, and a wire interconnecting the internal connecting terminal and the semiconductor chip; and that the thickness of the encapsulant lying above the wire at the highest position of the wire comes to be at least 0.8 times the thickness of the encapsulant lying beneath the wire at the same position; and curing or drying the encapsulant.

2. A semiconductor device fabrication process according to claim 1, wherein said solvent is contained in an amount of from 25% by weight to 50% by weight.

3. A semiconductor device fabrication process according to claim 1, wherein said solvent comprises a polar solvent having a vapor pressure lower than 10 mmHg at 40° C. and a vapor pressure not lower than 200 mmHg at 200° C.

4. A semiconductor device fabrication process according to claim 1, wherein said liquid resin encapsulant comprises at least one of;

a polyamide polymer obtained by condensation polymerization of at least one of an aromatic dicarboxylic acid and a reactive derivative of the aromatic dicarboxylic acid with diamine; and a polyamide-imide polymer obtained by condensation polymerization of at least one of an aromatic tricarboxylic acid and a reactive derivative of the aromatic tricarboxylic acid with diamine.

5. A semiconductor device process according to claim 1, which further comprises, before said encapsulation step;

a mounting step of mounting a semiconductor chip on a substrate having on the surface thereof a surface wiring and a first hollow place and being provided with a second hollow place in a bottom area of the first hollow place; the semiconductor chip being mounted in a bottom area of the second hollow place; and a wire-connecting step of interconnecting the internal connecting terminal provided on a substrate and the semiconductor chip through a wire;

said encapsulation step being the step of encapsulating at least the internal connecting terminal, the semiconductor chip and the wire.

6. A semiconductor device fabrication process according to claim 5, wherein said wire is held in the interior of the hollow place and second hollow place.

7. A semiconductor device fabrication process according to claim 1, comprising the step of mounting a semiconductor chip on a semiconductor chip package substrate having at least one cavity portion, wherein:

said semiconductor chip package substrate comprises wiring disposed along a surface of said substrate and a wall surface of said substrate in said cavity portion, said wiring comprises an external connection terminal portion for connecting to external connection terminals which are provided on the surface of said substrate at a side of said cavity portion's opening, an internal connection terminal portion for connecting to the mounted semiconductor chip, and a wiring portion disposed in between said external connection terminal portion and said internal connection terminal portion, said wiring portion is buried in a surface of said substrate and one of said wall surfaces of said substrate in said cavity portion, and said internal connection terminal portion is disposed inside of said cavity portion.

8. A semiconductor device fabrication process according to claim 1, comprising the steps of:

preparing a press forming assembly including an upper die with a plurality of a projected portions arrayed evenly in longitudinal and lateral directions, a wiring construction body comprising a plurality of wiring sets positioned in correspondence with the projected portions and a carrier metal foil, prepregs, and the lower die;

pressing the press forming assembly in between the upper and a lower dies to form a plurality of cavity portions on said substrate consisting of said pressed prepregs, and to bury said wiring into a surface of said substrate and wall surfaces of said substrate in said cavity portions in single process;

removing said carrier metal foil;

mounting the semiconductor chips;

sealing said cavity portions with resin;

forming external connection terminals; and dicing and separating into each device unit.

* * * * *